(12) United States Patent
Wen et al.

(10) Patent No.: US 7,298,636 B1
(45) Date of Patent: Nov. 20, 2007

(54) PACKET PROCESSORS HAVING MULTI-FUNCTIONAL RANGE MATCH CELLS THEREIN

(75) Inventors: Tingjun Wen, Kanata (CA); Tadeusz Kwasniewski, Ottawa (CA)

(73) Assignee: Integrated Device Technology, Inc., San Jose, CA (US)

( * ) Notice: Subject to any disclaimer, the term of this patent is extended or adjusted under 35 U.S.C. 154(b) by 9 days.

(21) Appl. No.: 11/393,284

(22) Filed: Mar. 30, 2006

Related U.S. Application Data

(60) Provisional application No. 60/780,481, filed on Mar. 8, 2006.

(51) Int. Cl.
*G11C 15/00* (2006.01)
(52) U.S. Cl. .................... 365/49; 365/189.07
(58) Field of Classification Search .............. 365/49, 365/185.18, 189.07
See application file for complete search history.

(56) References Cited

U.S. PATENT DOCUMENTS

| | | | |
|---|---|---|---|
| 4,845,668 A | 7/1989 | Sano et al. | |
| 5,059,942 A * | 10/1991 | Burrows ............... | 340/146.2 |
| 5,260,680 A | 11/1993 | Glass | |
| 5,345,411 A | 9/1994 | Yoneda | |
| 5,699,288 A | 12/1997 | Kim et al. | |
| 5,742,224 A | 4/1998 | Gadducci et al. | |
| 5,859,791 A | 1/1999 | Schultz et al. | |
| 6,044,005 A | 3/2000 | Gibson et al. | |
| 6,078,987 A | 6/2000 | Kongetira | |
| 6,166,938 A | 12/2000 | Wong | |
| 6,195,278 B1 | 2/2001 | Calin et al. | |
| 6,240,004 B1 | 5/2001 | Kuo et al. | |
| 6,256,216 B1 | 7/2001 | Lien et al. | |
| 6,349,049 B1 | 2/2002 | Schoy | |
| 6,353,646 B1 | 3/2002 | Rossignol | |
| 6,385,070 B1 | 5/2002 | Peterson | |
| 6,496,398 B2 | 12/2002 | Hellner et al. | |
| 6,618,280 B2 | 9/2003 | Takahashi et al. | |
| 6,631,086 B1 | 10/2003 | Bill et al. | |
| 6,633,953 B2 | 10/2003 | Stark | |
| 6,665,214 B1 | 12/2003 | Cheah et al. | |
| 6,707,718 B1 | 3/2004 | Halim et al. | |
| 6,742,105 B1 | 5/2004 | Ott | |
| 6,760,249 B2 | 7/2004 | Chien | |
| 6,766,317 B2 | 7/2004 | Sharma et al. | |

(Continued)

OTHER PUBLICATIONS

Spitznagel et al., "Packet Classification Using Extended TCAMs," Proceedings of the 11th IEEE International Conference on Network Protocols, 2003, 12 pages.

(Continued)

*Primary Examiner*—Thong Q. Le
(74) *Attorney, Agent, or Firm*—Myers Bigel Sibley & Sajovec PA

(57) ABSTRACT

A multi-functional match cell is responsive to first and second n-bit operands and configured so that the match cell operates as an n-bit range match cell when the first and second n-bit operands are equivalent, as an n-bit NOR-type CAM cell when the second n-bit operand is masked and as an n-bit NAND-type CAM cell when the first n-bit operand is masked, where "n" is a positive integer greater than one.

9 Claims, 18 Drawing Sheets

U.S. PATENT DOCUMENTS

| | | |
|---|---|---|
| 6,842,817 B2 | 1/2005 | Avery |
| 6,859,455 B1 | 2/2005 | Yazdani et al. |
| 6,901,476 B2 | 5/2005 | Stark et al. |
| 6,906,936 B1 | 6/2005 | James et al. |
| 6,947,302 B2 | 9/2005 | Ragev |
| 6,957,215 B2 | 10/2005 | Stark |
| 7,080,365 B2 * | 7/2006 | Broughton et al. ......... 717/146 |
| 2002/0036912 A1 | 3/2002 | Helwig |
| 2002/0141218 A1 | 10/2002 | Foss et al. |
| 2002/0152209 A1 | 10/2002 | Merugu et al. |
| 2003/0012063 A1 | 1/2003 | Chien |
| 2003/0035331 A1 | 2/2003 | Foss et al. |
| 2003/0097605 A1 | 5/2003 | Sharma et al. |
| 2003/0108043 A1 | 6/2003 | Liao |
| 2003/0123459 A1 | 7/2003 | Liao |
| 2003/0188299 A1* | 10/2003 | Broughton et al. ......... 717/141 |
| 2004/0133590 A1 | 7/2004 | Henderson et al. |
| 2004/0139274 A1 | 7/2004 | Hui |
| 2004/0213275 A1 | 10/2004 | Basso et al. |
| 2004/0225782 A1 | 11/2004 | Avery |
| 2005/0144413 A1 | 6/2005 | Kuo et al. |
| 2005/0213360 A1 | 9/2005 | Park |
| 2006/0002386 A1 | 1/2006 | Yik et al. |

OTHER PUBLICATIONS

"All Elementary Mathematics—Study Guide—Algebra—Inequalities: common information," http://www.bymath.com/studyguide/alg/sec/alg27.html, 1 page.

Spitznagel, Edward W., "CMOS Implementation of a Range Check Circuit," Washington University in St. Louis, School of Engineering & Applied Science, Department of Computer Science & Engineering, WUCSE-2004-39, Jul. 6, 2004, 11 pages.

Pagiamtzis et al., "Content-Addressable Memory (CAM) Circuits and Architectures: A Tutorial and Survey," IEEE Journal of Solid-State Circuits, vol. 41, No. 3, Mar. 2006, pp. 712-727.

Kim et al., "Storage- and Power-Efficient Range-Matching TCAM for Packet Classification," 2006 IEEE International Solid-State Circuits Conference, Feb. 7, 2006, pp. 168-169, 646.

"All Elementary Mathematics—Study Guide—Algebra—Inequalities: common information," http://www.bymath.com/studyguide/alg/sec/alg27.html, 1 page, Jan. 2005.

* cited by examiner

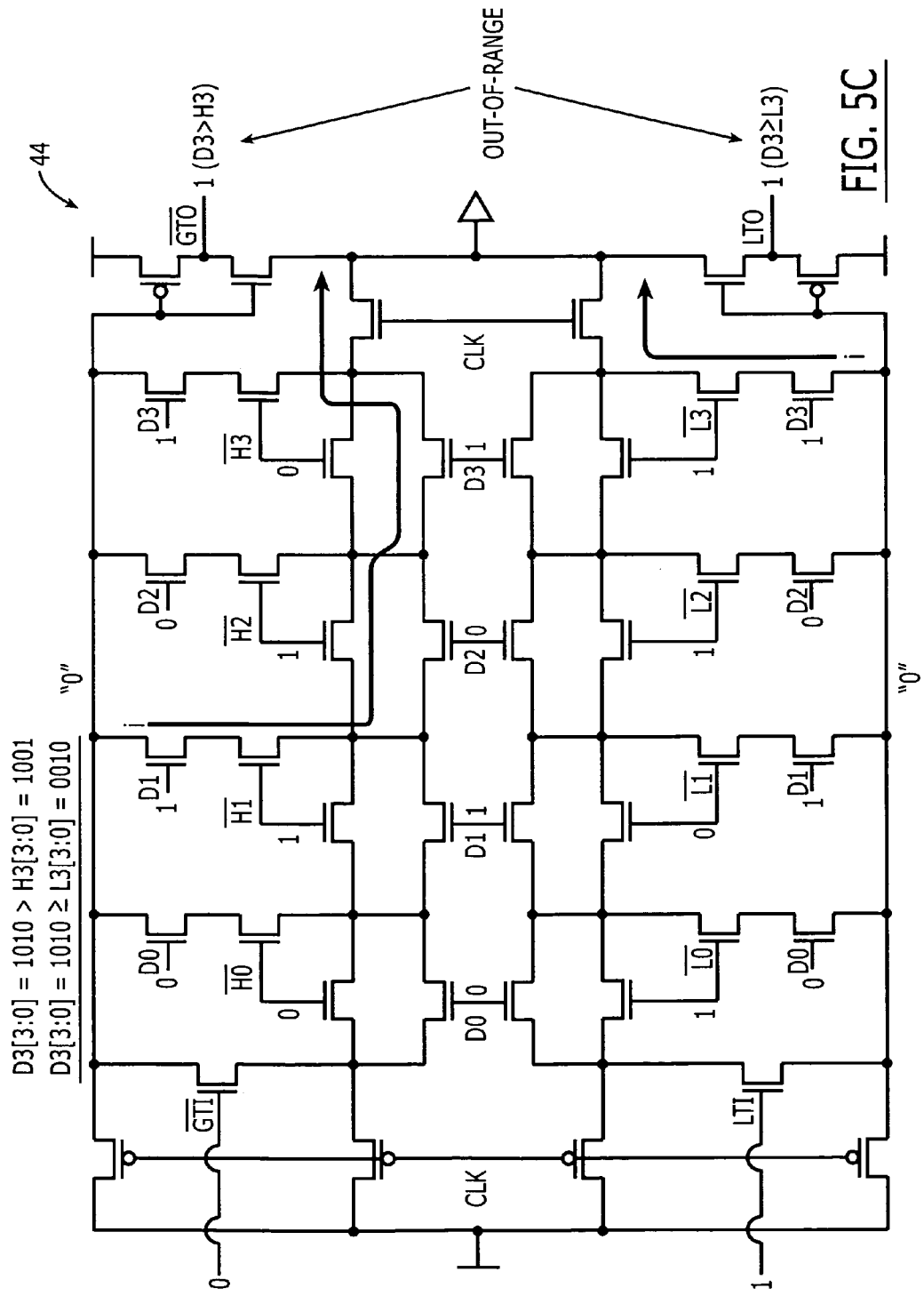

PACKET PROCESSORS HAVING MULTI-FUNCTIONAL RANGE MATCH CELLS THEREIN

REFERENCE TO PRIORITY APPLICATION

This application claims priority to U.S. Provisional Application Ser. No. 60/780,481, filed Mar. 8, 2006, the disclosure of which is hereby incorporated herein by reference.

CROSS-REFERENCE TO RELATED APPLICATION

This application is related to copending U.S. application Ser. No. 11/393,489, filed Mar. 30, 2006, entitled: "Packet Processors Having Comparators Therein That Determine Non-Strict Inequalities Between Applied Operands," the disclosure of which is hereby incorporated herein by reference.

FIELD OF THE INVENTION

The present invention relates to integrated circuit devices and, more particularly, to integrated circuit comparators.

BACKGROUND OF THE INVENTION

Packet classification operations are frequently performed in high performance routers to determine how packets received at an input of a router are classified. This classification typically determines both an output port to which a packet should be sent and also determines what, if any, special handling the packet should receive. Typical packet classification operations utilize packet filters. Such filters may specify values of source and destination address fields of an IP header, a protocol field and source and destination port numbers, for example. Conventional packet classification operations have frequently utilized only a limited number of packet filters, which makes it possible to match every incoming packet against a predefined and ordered sequence of filters. Unfortunately, these conventional packet classification operations typically do not scale efficiently to systems having high packet processing rates and/or large packet filtering requirements.

Ternary content addressable memories (TCAMs) support packet processing operations by enabling comparisons to be performed in parallel between an applied search key (e.g., packet or field within a packet) and a plurality of stored data patterns (i.e., CAM entries), which are typically configured as a plurality of value and bit mask pairs within a corresponding plurality of TCAM cells. However, the typical drawbacks of TCAMs are relatively high power consumption and relatively inefficient representation of filters containing ranges to be matched. Such filters are typically handled by using multiple TCAM entries for each stored data pattern having at least one field therein that specifies a range to be matched. But, representing each data pattern using multiple TCAM entries can reduce the effective capacity of a TCAM by a factor of two or typically much greater than two in most applications. These shortcomings associated with TCAMs are more fully described in an article by Ed Spitznagel et al., entitled "Packet Classification Using Extended TCAMs," Proceedings of the 11$^{th}$ IEEE International Conference on Network Protocols (2003). As described in this article, one way to better handle filters when performing packet processing is to expand TCAM functionality to directly incorporate range check circuits within a TCAM core. These range check circuits are also described in a technical report by Ed Spitznagel, entitled "CMOS Implementation of a Range Check Circuit," Washington University, Report No. WUCSE-2004-39 (2004). In particular, this report describes storing lower and upper bounds for each range to be matched and using dedicated range check circuitry, which performs a comparison using a set of stages. Techniques for performing range matching are also disclosed in U.S. Pat. No. 6,742,105 to Ott, entitled "Method and System for Range Matching;" and U.S. Pat. No. 6,766,317 to Sharma et al., entitled "Range Check Cell and a Method for The Use Thereof."

SUMMARY OF THE INVENTION

Packet processors and other integrated circuit devices according to embodiments of the present invention include comparators that determine non-strict inequalities between operands applied thereto. These integrated circuit comparators can be used to efficiently perform range match operations within packet processors and other types of search engine and classification devices. Each comparator includes at least one n-bit comparator cell. This comparator cell is configured to determine a non-strict inequality between a first n-bit operand (e.g., A[n−1, . . . , 0]) and a second n-bit operand (e.g., B[n−1, . . . , 0]). The comparator cell determines the non-strict inequality by computing a control output signal $C_o$ (or its complement), where:

$$C_o = (\ldots ((C_i(A_o + \overline{B_o}) + A_o\overline{B_o})(A_1 + \overline{B_1}) \ldots (A_{n-2} + \overline{B_{n-2}})(A_{n-1} + \overline{B_{n-1}}) + A_{n-1}\overline{B_{n-1}},$$

"n" is a positive integer greater than one and $C_i$ is a control input signal that specifies an interpretation to be given to the control output signal $C_o$.

Some embodiments of the n-bit comparator cell can include first, second, third and fourth pairs of MOS transistors. The first pair of MOS transistors, which are electrically connected in parallel between first and second nodes, have gate terminals that receive operand bit A0 and a complement of operand bit B0. The second pair of MOS transistors, which are electrically connected in parallel between the second node and a third node, have gate terminals that receive operand bit A1 and a complement of operand bit B1. The third pair of MOS transistors, which are electrically connected in series between the first (or second) node and a fourth node (e.g., primary node), have gate terminals that receive the operand bit A0 and the complement of operand bit B0. The fourth pair of MOS transistors, which are electrically connected in series between the second (or third) node and the fourth node, have gate terminals that receive the operand bit A1 and the complement of operand bit B1.

According to still further embodiments of the invention, the comparator cell is configured so that each one bit increase in "n" results in a four transistor increase in cell size for "n" in at least the following range of n: $2 \leq n \leq 6$, and possibly a much greater range depending on cell configuration, power supply voltage and transistor threshold voltage, for example. The comparator cell may also be configured so that the n-bit comparator cell is an M-transistor cell, where M is a positive integer in a range from 4n+2 to 4n+6. According to further aspects of this comparator cell, a MOS input transistor is provided. This MOS input transistor has a first current carrying terminal electrically connected to the first node, a second current carrying terminal electrically connected to the fourth node and a gate terminal that receives the control input signal $C_i$.

According to still further embodiments of the present invention, a comparator cell is provided that is responsive to a control input signal ($C_i$) and first and second multi-bit operands. The comparator cell is configured to generate a control output signal ($C_o$) that encodes a "≦" inequality between the first and second multi-bit operands when the control input signal is in a first logic state and encodes a "≧" inequality between the first and second multi-bit operands when the control input signal is in a second logic state. The comparator cell may be further configured so that the control output signal determines a "≦" or ">" inequality between the first and second multi-bit operands when the control input signal is in the first logic state. This control output signal may also determine a "≧" or "<" inequality between the first and second multi-bit operands when the control input signal is in the second logic state.

Additional embodiments of the present invention include a multi-functional match cell, which is responsive to first and second n-bit operands. These first and second operands may be n-bit differential signals. For example, the first n-bit operand may be the n-bit differential signal D and /D (also referred to herein as D[n−1, . . . , 0] and /D[n−1, . . . , 0]) and the second n-bit operand may be the n-bit differential signal D' and /D' (also referred to herein as D'[n−1, . . . , 0] and /D'[n−1, . . . , 0]). The multi-functional match cell is configured so that the match cell operates as an n-bit range match cell when the first and second n-bit operands are equivalent (i.e., D=D' and /D=/D'). The functional operation of the match cell can be modified by masking either the second n-bit operand or the first n-bit operand. In particular, the match cell can be configured as an n-bit NOR-type CAM cell when the second n-bit operand is masked (e.g., D and /D' set to all 1s) or as an n-bit NAND-type CAM cell when the first n-bit operand is masked (e.g., D and /D set to all 0s), where "n" is a positive integer greater than one.

According to these embodiments, the multi-functional match cell may include an upper bound comparison circuit, which is responsive to an upper bound or its complement, and a lower bound comparison circuit, which is responsive to a lower bound or its complement. This upper bound comparison circuit may be configured to evaluate whether the first n-bit operand D[n−1, . . . , 0] applied thereto is "≦" or ">" the upper bound (e.g., H[n−1, . . . , 0]) in accordance with the following upper bound relationship or its boolean or complementary equivalents:

$$GTO = (((GTI(\overline{D_0}+H_0)+\overline{D_0}H_0)(\overline{D_1}+H_1)(\overline{D_2}+H_2)+\overline{D_2}H_2)(\overline{D_3}H_3)+\overline{D_3}H_3,$$

where GTI is an upper bound control input signal and GTO is an upper bound control output signal. In contrast, the lower bound comparison circuit may be configured to evaluate whether the first n-bit operand D[n−1, . . . , 0] applied thereto is "<" or "≧" the lower bound (e.g., L[n−1, . . . , 0]) in accordance with the following lower bound relationship or its boolean or complementary equivalents:

$$LTO = ( \ldots ((LTI(D_0+\overline{L_0})+D_0\overline{L_0})(D_1+\overline{L_0})+D_1\overline{L_1}) \ldots (D_{n-2}+\overline{L_{n-2}})+D_{n-2}\overline{L_{n-2}})(D_{n-1}+\overline{L_{n-1}})+D_{n-1}\overline{L_{n-1}},$$

where LTI is a lower bound control input signal and LTO is a lower bound control output signal.

Another range match circuit according to embodiments of the invention includes a range match circuit that is configured to evaluate whether an operand D[n−1, . . . , 0] applied thereto is within a range between an upper bound H[n−1, . . . , 0] and a lower bound L[n−1, . . . , 0]. This evaluation is performed in accordance with the following upper bound and lower bound relationships or their boolean or complementary equivalents:

$$\overline{GTO} = ( \ldots ((\overline{GTI}(D_0+\overline{H_0})+D_0\overline{H_0})+D_1+\overline{H_0}) \ldots (D_{n-2}+\overline{H_{n-2}})+D_{n-2\overline{n-2}})(D_{n-1}+\overline{H_{n-1}})+D_{n-1}\overline{H_{n-1}},$$

and $$LTO = ( \ldots ((LTI(D_0+\overline{L_0})+D_0\overline{L_0})(D_1+\overline{L_1}) \ldots (D_{n-2}+\overline{L_{n-2}})+D_{n-2}\overline{L_{n-2}})(D_{n-1}+\overline{L_{n-1}})+D_{n-1}\overline{L_{n-1}},$$

where LTI and /GTI are control input signals and LTO and /GTO are control output signals. Based on this configuration, the n-bit range match cell generates a control output signal that encodes a "≦" inequality between the multi-bit operand D and an upper bound operand H and a "≧" inequality between the multi-bit operand D and a lower bound operand L when the upper bound control signal is in a first logic state and the lower bound control signal is in a second logic state opposite the first logic state.

BRIEF DESCRIPTION OF THE DRAWINGS

FIG. 5C is an electrical schematic of the 4-bit range match cell of FIG. 4B with annotations that illustrate an out-of-range match example.

DETAILED DESCRIPTION OF PREFERRED EMBODIMENTS

Figure 1A:
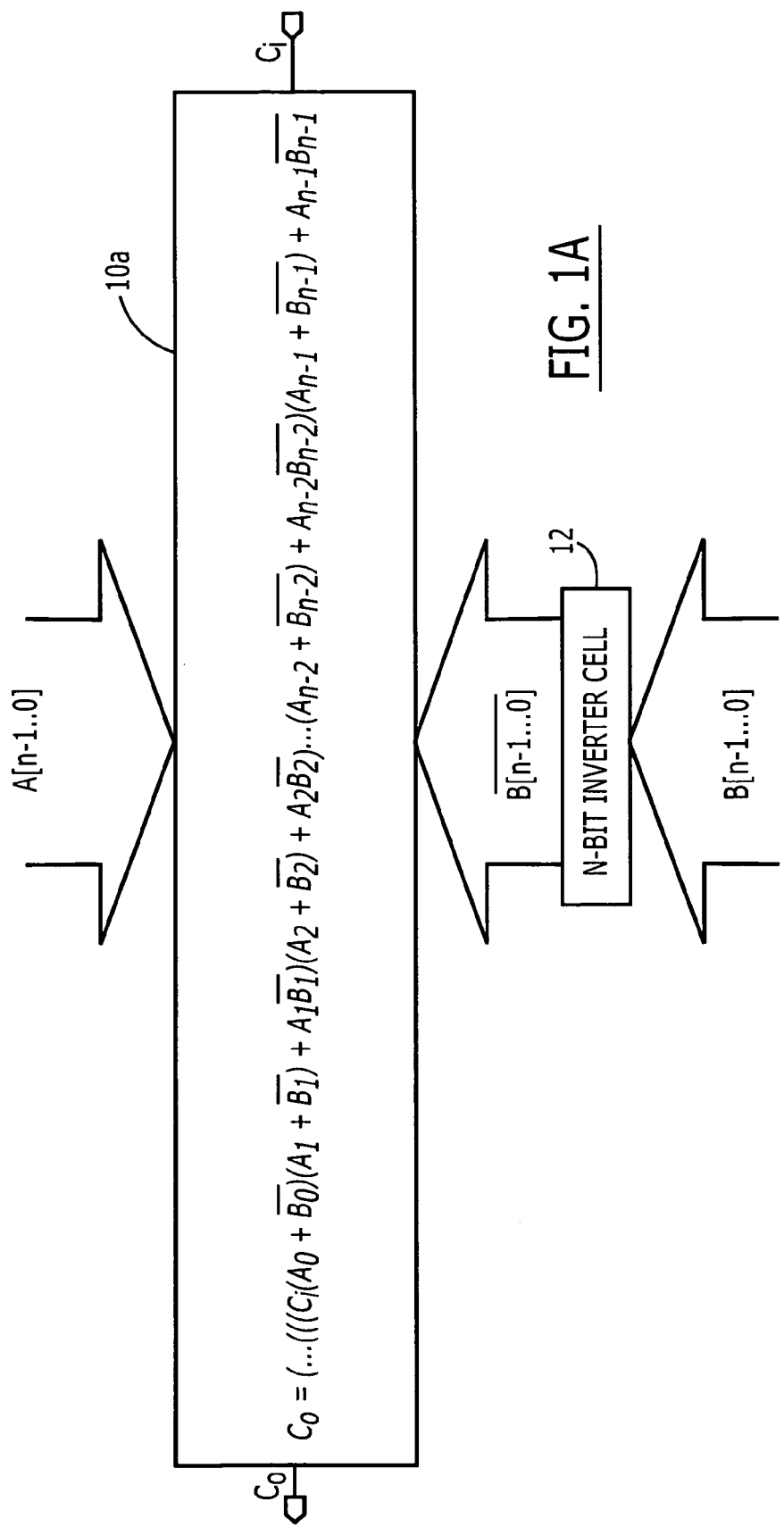
FIG. 1A is a block diagram illustrating non-strict equivalency operations performed by a comparator according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals; and each expression described herein includes its boolean and complementary equivalent. The suffix B (or prefix symbol "/") to a signal name may also denote a complementary data or information signal or an active low control signal, for example.

Referring now to FIGS. 1A-1D, an integrated circuit comparator $10a$ according to embodiments of the invention is configured to determine a non-strict inequality between a pair of n-bit operands applied thereto. These two operands are illustrated in FIG. 1A as a first n-bit operand (e.g., A [n−1, . . . , 0]) and a second n-bit operand (e.g., B [n−1, . . . , 0]). A bitwise negated version of the second n-bit operand is generated by an n-bit inverter cell 12 and provided directly to the comparator $10a$. The n-bit comparator $10a$ generates a single control output signal $C_o$ in response to a single control input signal $C_i$ that specifies how the control output signal $C_o$ should be interpreted. In particular, when the control input signal $C_i=0$, then the control output signal $C_o$ will equal 0 if $A \leq B$ or $C_o$ will equal 1 if $A>B$. Alternatively, when the control input signal $C_i=1$, then the control output signal $C_o$ will equal 0 if $A<B$ or $C_o$ will equal 1 if $A \geq B$. These values of the control output signal $C_o$ are determined by the following expression (1) (or its boolean or complementary equivalents):

$$C_o=( \ldots ((C_i(A_0+\overline{B_0})+A_0\overline{B_0})(A_1+\overline{B_1})+A_1\overline{B_1}) \ldots (A_{n-2}+\overline{B_{n-2}})+A_{n-2}\overline{B_{n-2}})(A_{n-1}+\overline{B_{n-1}})+A_{n-1}\overline{B_{n-1}}. \quad (1)$$

For the case of a 1-bit comparator $10a$, expression (1) simplifies to the following expression (2):

$$C_o=C_i(A_0+\overline{B_0})+A_0\overline{B_0}. \quad (2)$$

The truth table (TABLE 1) for expression (2) is provided as:

TABLE 1

| $C_i$ | A | B | $C_o$ | INTERPRETATION |
|---|---|---|---|---|
| 0 | 0 | 0 | 0 | <= |
| 0 | 0 | 1 | 0 | <= |
| 0 | 1 | 0 | 1 | > |
| 0 | 1 | 1 | 0 | <= |
| 1 | 0 | 0 | 1 | >= |
| 1 | 0 | 1 | 0 | < |
| 1 | 1 | 0 | 1 | >= |
| 1 | 1 | 1 | 1 | >= |

As illustrated by TABLE 1, the value of the control output signal $C_o$ is a function of the value of the control input signal $C_i$. When the control input signal $C_i$ is set to a logic 0 value (as shown in the top half of TABLE 1), then the value of the control output signal $C_o$ signifies either a non-strict inequality that operand A is less than or equal to operand B or a strict inequality that operand A is greater than operand B. Alternatively, when the control input signal $C_i$ is set to a logic 1 value (as shown in the bottom half of TABLE 1), then the value of the control output signal $C_o$ signifies either a non-strict inequality that operand A is greater than or equal to operand B or a strict inequality that operand A is less than operand B.

For the case of a 2-bit comparator $10a$, expression (1) simplifies to the following expression (3):

$$C_o=(C_i(A_0+\overline{B_0})+A_0\overline{B_0})(A_1+\overline{B_1})+A_1\overline{B_1}. \quad (3)$$

The truth table (TABLE 2) for expression (3) is provided as:

TABLE 2

| $C_i$ | A | B | $C_o$ | INTERPRETATION |
|---|---|---|---|---|
| 0 | 00 | 00 | 0 | <= |
| 0 | 00 | 01 | 0 | <= |
| 0 | 00 | 10 | 0 | <= |
| 0 | 00 | 11 | 0 | <= |
| 0 | 01 | 00 | 1 | > |
| 0 | 01 | 01 | 0 | <= |
| 0 | 01 | 10 | 0 | <= |
| 0 | 01 | 11 | 0 | <= |
| 0 | 10 | 00 | 1 | > |
| 0 | 10 | 01 | 1 | > |
| 0 | 10 | 10 | 0 | <= |
| 0 | 10 | 11 | 0 | <= |
| 0 | 11 | 00 | 1 | > |
| 0 | 11 | 01 | 1 | > |
| 0 | 11 | 10 | 1 | > |
| 0 | 11 | 11 | 0 | <= |
| 1 | 00 | 00 | 1 | >= |
| 1 | 00 | 01 | 0 | < |
| 1 | 00 | 10 | 0 | < |
| 1 | 00 | 11 | 0 | < |
| 1 | 01 | 00 | 1 | >= |
| 1 | 01 | 01 | 1 | >= |
| 1 | 01 | 10 | 0 | < |
| 1 | 01 | 11 | 0 | < |
| 1 | 10 | 00 | 1 | >= |
| 1 | 10 | 01 | 1 | >= |
| 1 | 10 | 10 | 1 | >= |
| 1 | 10 | 11 | 0 | < |
| 1 | 11 | 00 | 1 | >= |
| 1 | 11 | 01 | 1 | >= |
| 1 | 11 | 10 | 1 | >= |
| 1 | 11 | 11 | 1 | >= |

Figure 1B:
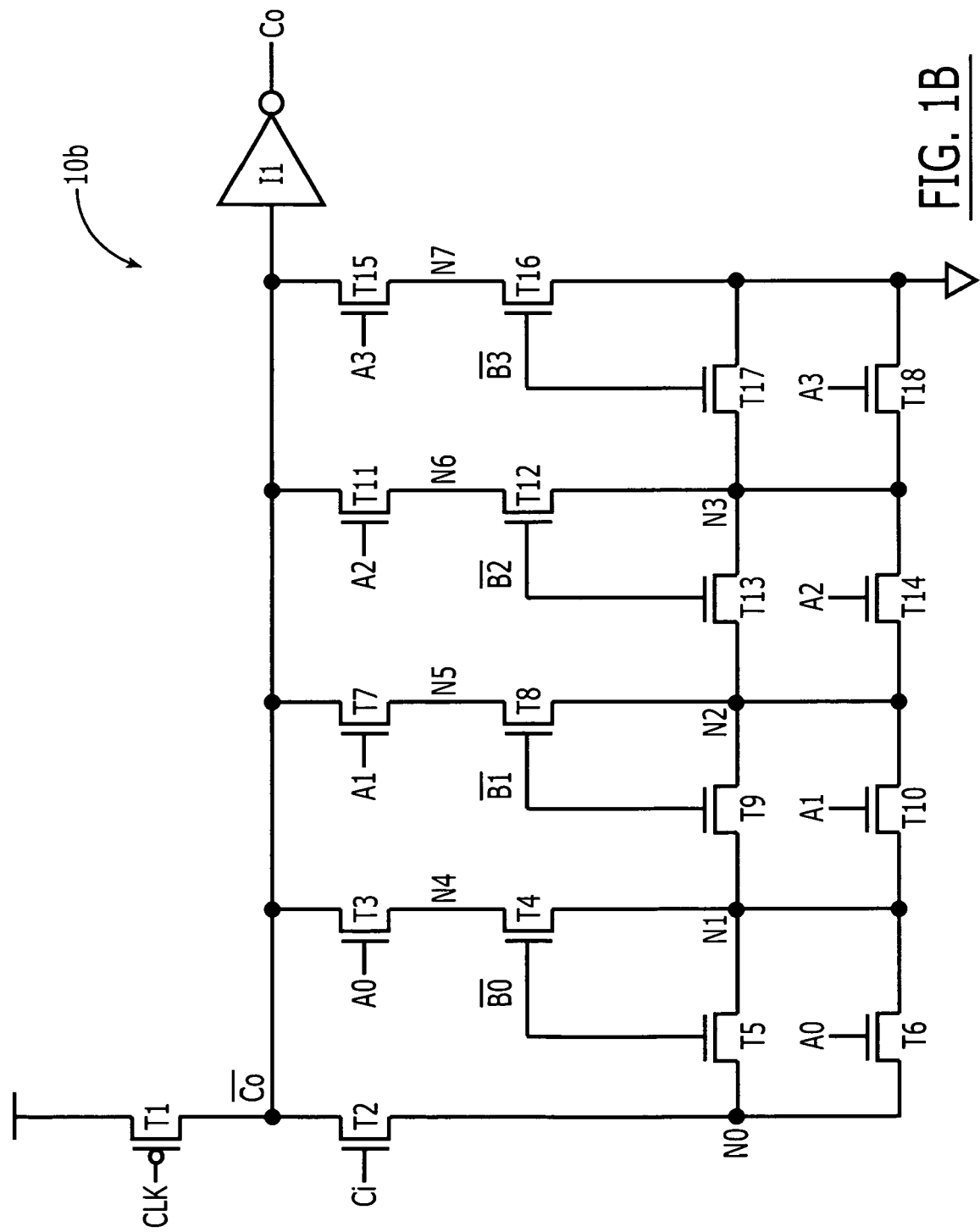
FIG. 1B is an electrical schematic of a 4-bit comparator cell according to embodiments of the present invention.
Figure 1C:
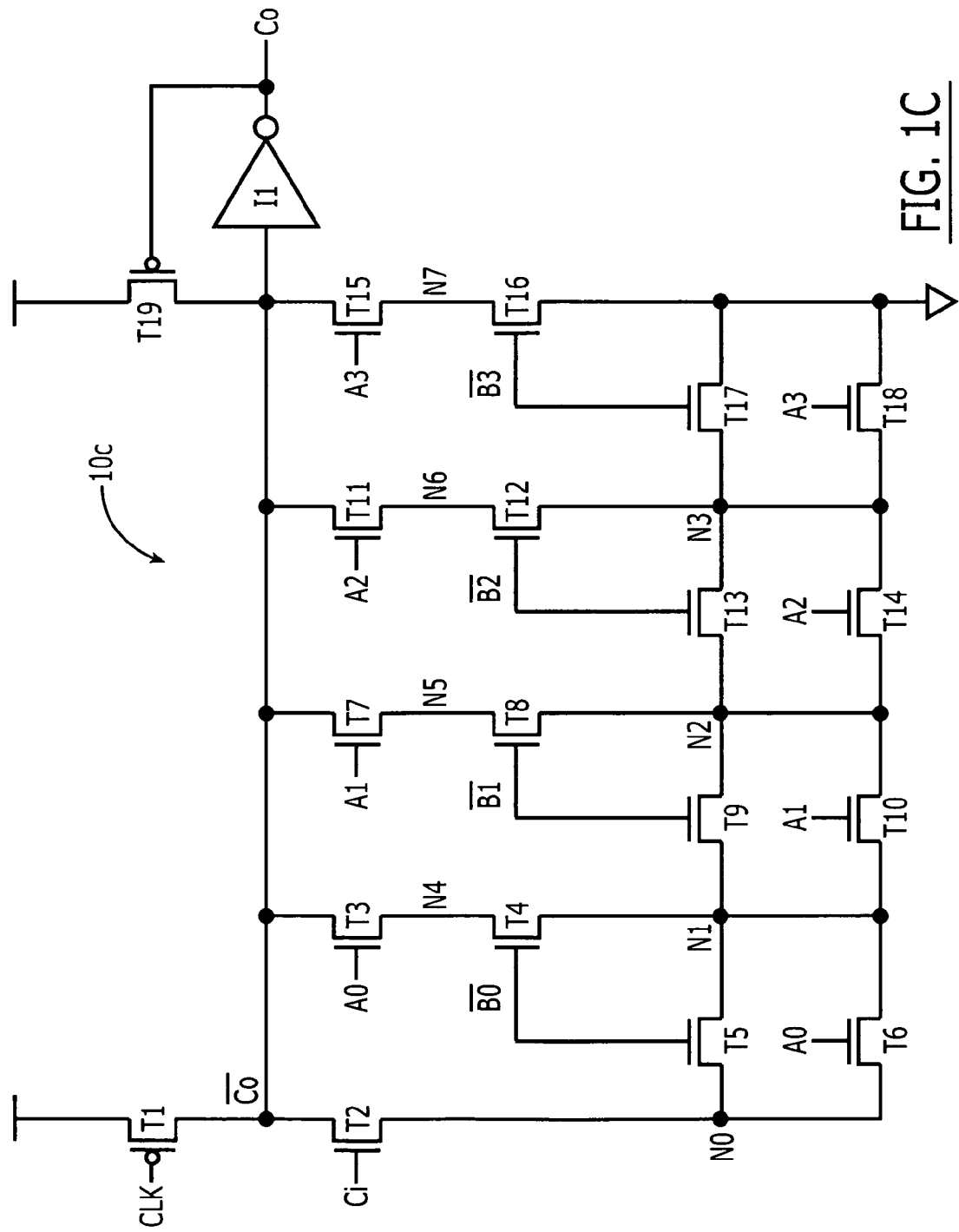
FIG. 1C is an electrical schematic of a 4-bit comparator cell according to embodiments of the present invention.

FIGS. 1B-1C illustrate alternative embodiments of the 4-bit comparator of FIG. 1A, which determines a non-strict inequality between applied operands according to the following expression (4):

$$C_o=(((C_i(A_0+\overline{B_0})+A_0\overline{B_0})(A_1+\overline{B_1})+A_2\overline{B_2})(A_2+\overline{B_2})+A_2\overline{B_2}(A_3+\overline{B_3})+A_3\overline{B_3} \quad (4)$$

As illustrated by FIG. 1B, the 4-bit comparator $10b$ is illustrated as a 20T comparator cell with inverter I1 representing a 2T CMOS inverter. This 4-bit comparator $10b$ is configured so that each one bit increase in "n" results in a four transistor increase in cell size for "n" in at least the following range: $2 \leq n \leq 6$. Transistor T1 has a gate terminal that receives a clock signal CLK and input transistor T2 has a gate terminal that receives the control input signal $C_i$. A high-to-low transition of the clock signal CLK during a precharge time interval operates to precharge a primary node (node $/C_o$) of the comparator cell to a level 1 voltage (e.g., Vdd) and thereby set the control output signal $C_o$ to a logic 0 voltage. During an evaluation time interval when a comparison operation is to be performed, the clock signal CLK is switched low-to-high and maintained at a logic 1 voltage. The four bits of operand A (i.e., A[3:0]) and the four bits of the complement of operand B (i.e., B[3:0]) are provided to transistors T3-T18, as illustrated. NMOS transistors T5 and T6 are connected in parallel between node N0 and node N1. NMOS transistors T9 and T10 are connected in parallel between node N1 and node N2. NMOS transistors T13 and T14 are connected in parallel between node N2 and node N3. NMOS transistors T17 and T18 are connected in parallel between node N3 and a ground signal line Vss. NMOS transistors T3 and T4 are connected in series between node N1 and the primary node (node $/C_o$). NMOS transistors T7 and T8 are connected in series between node N2 and the primary node. NMOS transistors T11 and T12 are connected in series between node N3 and the primary node. NMOS transistors T15 and T16 are connected in series between the ground signal line Vss and the primary node. In the event the inverter I1 is omitted from the comparator 10b and the primary node/$C_o$ is provided directly as an output signal, then the comparator 10b is configured as 4n+2 transistors. Nonetheless, the inverter I1 is useful because it regenerates the control output signal between stages in a multi-stage comparator.

Figure 1D:
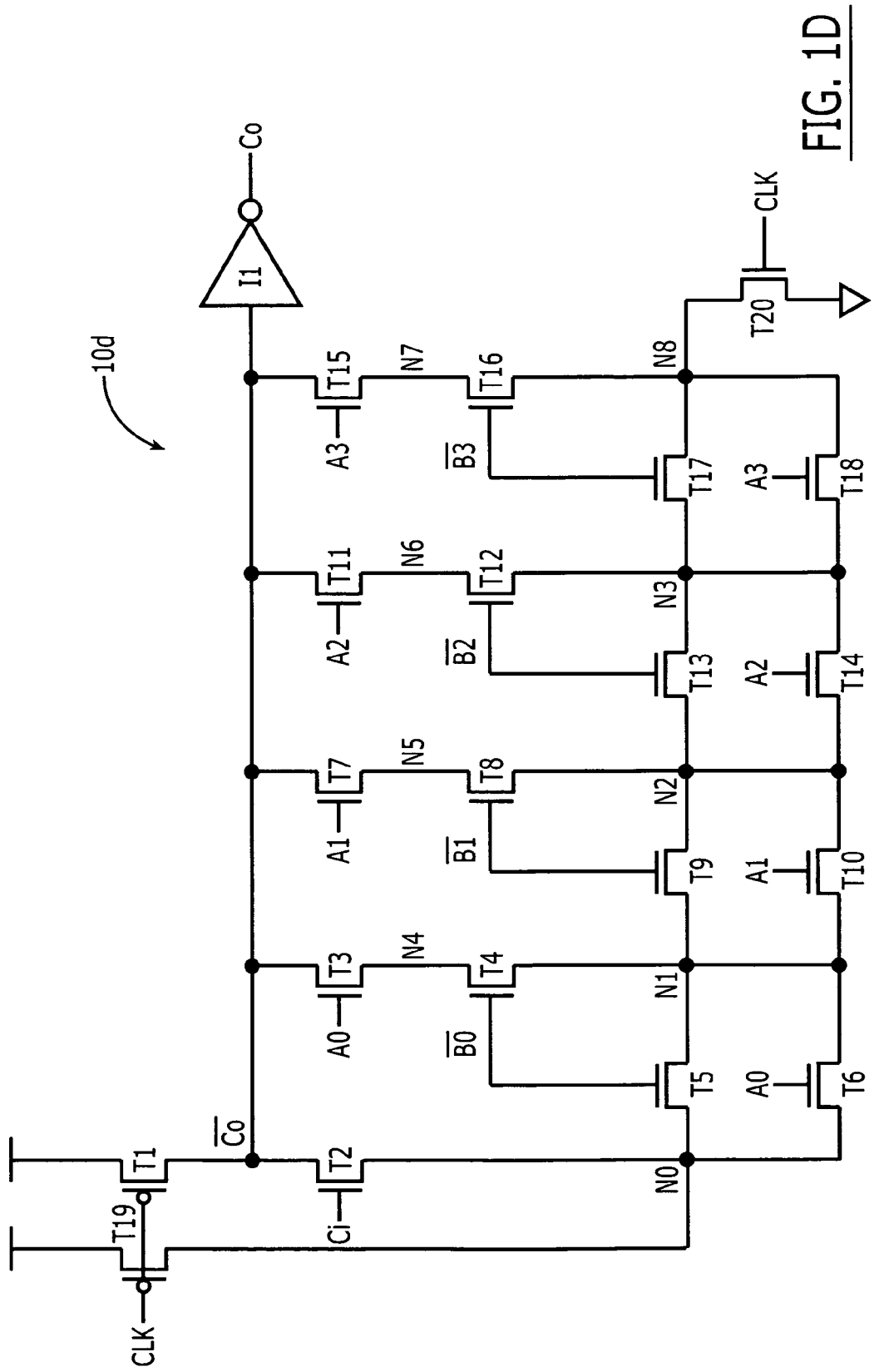
FIG. 1D is an electrical schematic of a 4-bit comparator cell according to embodiments of the present invention.

The 4-bit comparators 10c and 10d of FIGS. 1C and 1D, respectively, represent alternatives to the 4-bit comparator 10b of FIG. 1B, which take into account and compensate for non-ideal transistor characteristics. The comparator 10c of FIG. 1C includes 4n+5 transistors and the comparator 10d of FIG. 1D includes 4n+6 transistors. In particular, to prevent leakage currents from possibly pulling the primary node (node $/C_o$) low during an evaluation time interval, a relatively weak pull-up transistor T19 is provided in the comparator 10c to support a logic 1 precharge voltage on the primary node. This logic 1 precharge voltage is only maintained in the absence of a "stronger" pull-down current path provided between the primary node and a ground signal line (shown as Vss), which is electrically connected to source terminals of NMOS transistors T16, T17 and T18. Moreover, as illustrated by FIG. 1D, many of the internal nodes of the comparator cell 10d can be precharged high to a logic 1 voltage by turning off NMOS pull-down transistor T20 and turning on PMOS pull-up transistor T19 during the precharge time interval (when CLK=0). The internal nodes N1-N8 can also be precharged by temporarily setting one or both of the operands to all logic 1 values during the precharge time interval (i.e., A=1111 and /B=1111 during the precharge time interval).

Figure 2A:
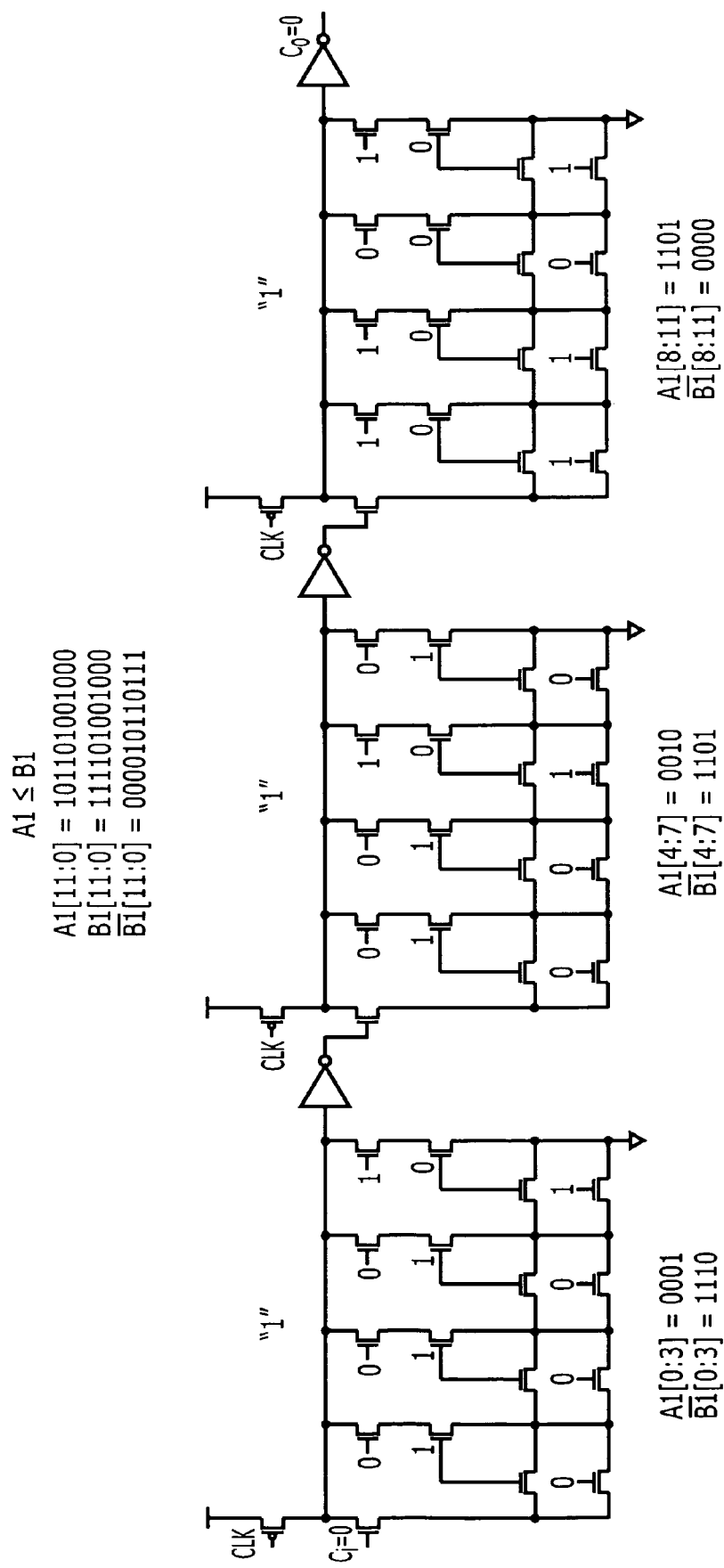
FIG. 2A is an electrical schematic showing 3-stages of a 4-bit comparator cell according to embodiments of the present invention.
Figure 2B:
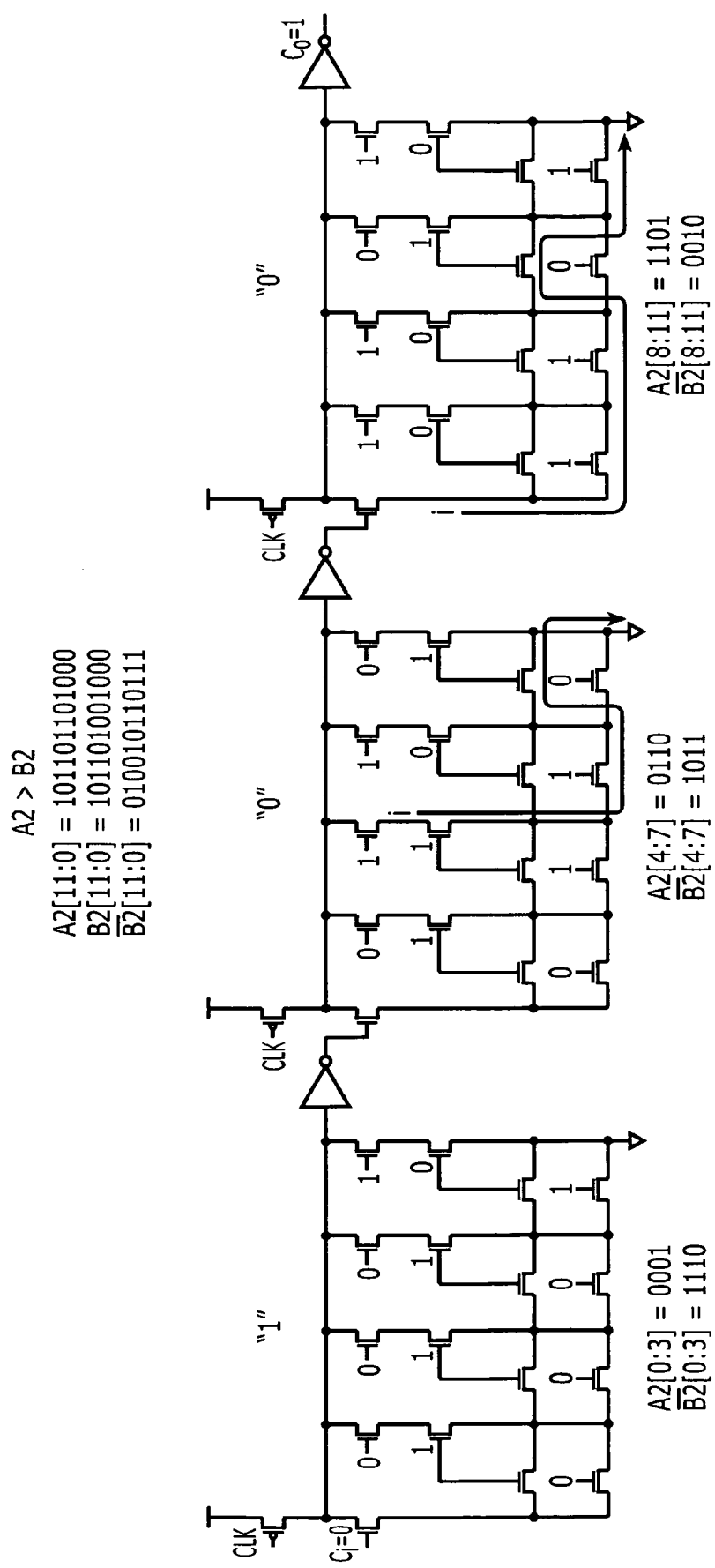
FIG. 2B is an electrical schematic showing 3-stages of a 4-bit comparator cell according to embodiments of the present invention.
Figure 2C:
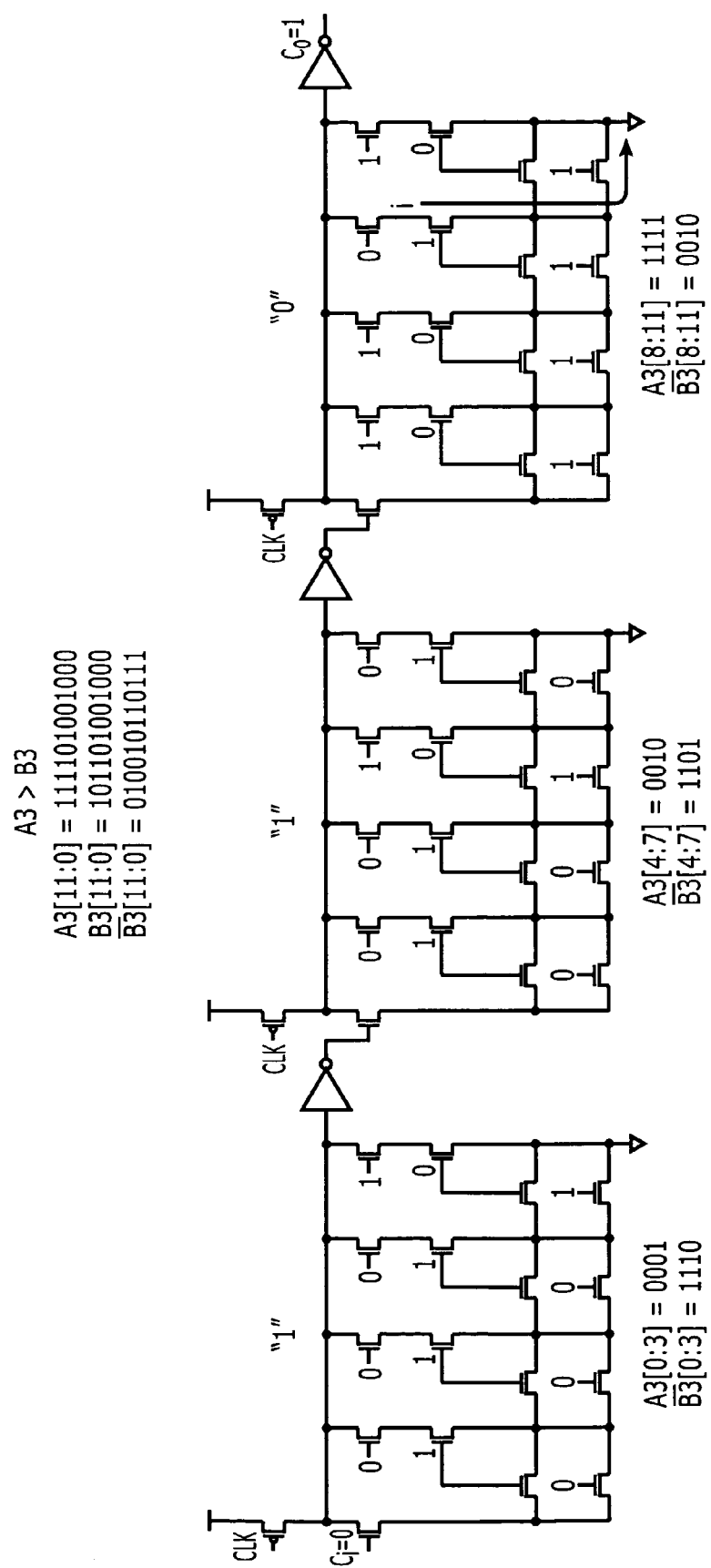
FIG. 2C is an electrical schematic showing 3-stages of a 4-bit comparator cell according to embodiments of the present invention.

The above-described 4-bit comparators of FIGS. 1B-1D may be connected as a plurality of stages to thereby define a larger comparator of desired length. For example, FIG. 2A illustrates a 12-bit comparator containing three (3) stages of the 4-bit comparator 10b of FIG. 1B. Moreover, FIG. 2A contains annotations illustrating how a determination is made that one 12-bit operand A1[11:0]=101101001000 is less than or equal to another 12-bit operand B1[11:0]= 111101001000, for the case where the control input signal $C_i$ is set to a logic 0 voltage. For this example, each primary node ($/C_o$) within each stage remains at a logic 1 voltage and the final control output signal $C_o$ is set to a logic 0 voltage to reflect the fact that A1≦B1. FIG. 2B, which illustrates a 12-bit comparator containing three (3) stages of the 4-bit comparator 10b of FIG. 1B, contains annotations illustrating how a determination is made that one 12-bit operand A2[11:0]=101101101000 is greater than another 12-bit operand B2[11:0]=101101001000, for the case where the control input signal $C_i$ is set to a logic 0 voltage. Similarly, the 12-bit comparator of FIG. 2C contains annotations illustrating how a determination is made that operand A3[11:0]= 111101001000 is greater than operand B3[11:0]= 101101001000, for the case where the control input signal $C_i$ is set to a logic 0 voltage.

The integrated circuit comparator 10a of FIG. 1A may be configured to support boolean equivalent operations to those illustrated by expression (1). In particular, equation (1) may be rewritten as:

$$C_o = ((\ldots((C_i + A_0\overline{B_0})(A_0 + \overline{B_0}) + A_1\overline{B_1})(A_1 + \overline{B_1}) \ldots \\ + A_{n-2}\overline{B_{n-2}})(A_{n-2} + \overline{B_{n-2}}) + A_{n-1}\overline{B_{n-1}})(A_{n-1} + \overline{B_{n-1}}). \quad (5)$$

This equivalency between expression (1) and expression (5) can be demonstrated most readily by rewriting expression (5) for the case where n=1:

$$\begin{aligned}
C_o &= (C_i + A_0\overline{B_0})(A_0 + \overline{B_0}) \\
&= C_iA_0 + C_i\overline{B_0} + A_0\overline{B_0}A_0 + A_0\overline{B_0}\,\overline{B_0} \\
&= C_iA_0 + C_i\overline{B_0} + A_0\overline{B_0} + A_0\overline{B_0} \\
&= C_iA_0 + C_i\overline{B_0} + A_0\overline{B_0} \\
&= C_i(A_0 + \overline{B_0}) + A_0\overline{B_0}
\end{aligned}$$

Figure 1E:
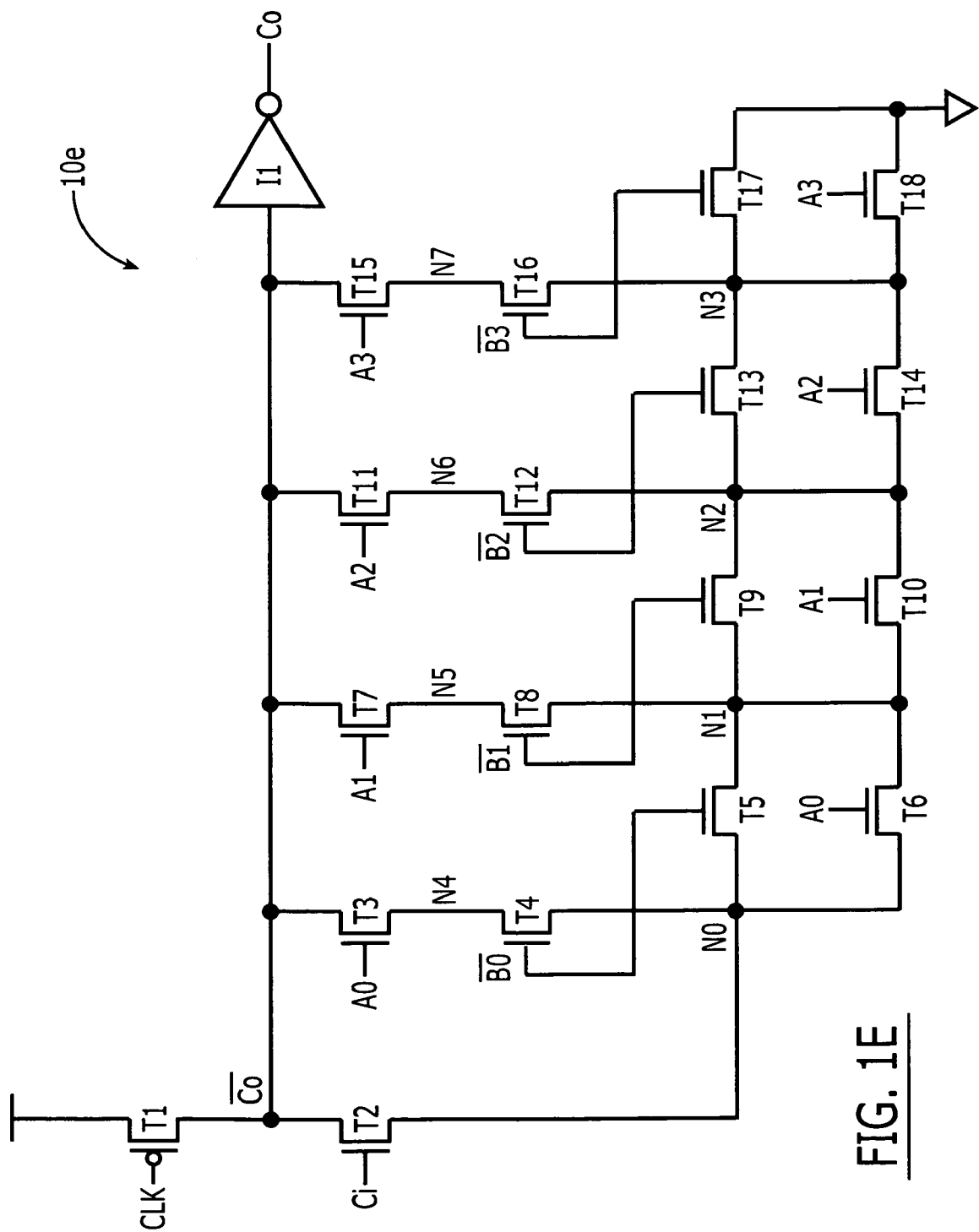
FIG. 1E is an electrical schematic of a 4-bit comparator cell according to embodiments of the present invention.

FIG. 1E illustrates a 4-bit comparator 10e that is configured to perform a non-strict inequality in accordance with expression (5) for the case where n equals 4. The comparator 10e of FIG. 1E is similar to the comparator 10b of FIG. 1B, however, locations of nodes N0, N1, N2 and N3 have been shifted relative to the source terminals of NMOS transistors T4, T8, T12 and T16.

Expression (1) may also be rewritten using exclusive-OR operators as:

$$C_o = (\ldots((C_i(A_0 \oplus \overline{B_0}) + A_0\overline{B_0})(A_1 \oplus \overline{B_1}) + A_1\overline{B_1}) \ldots \\ (A_{n-2} \oplus \overline{B_{n-2}})(A_{n-1} \oplus \overline{B_{n-1}}) + A_{n-1}\overline{B_{n-1}}. \quad (6)$$

Expression (6) may be further modified into an alternative equivalent boolean expression by replacing each remaining "+" operation with an exclusive-OR operation (⊕).

Figure 3:
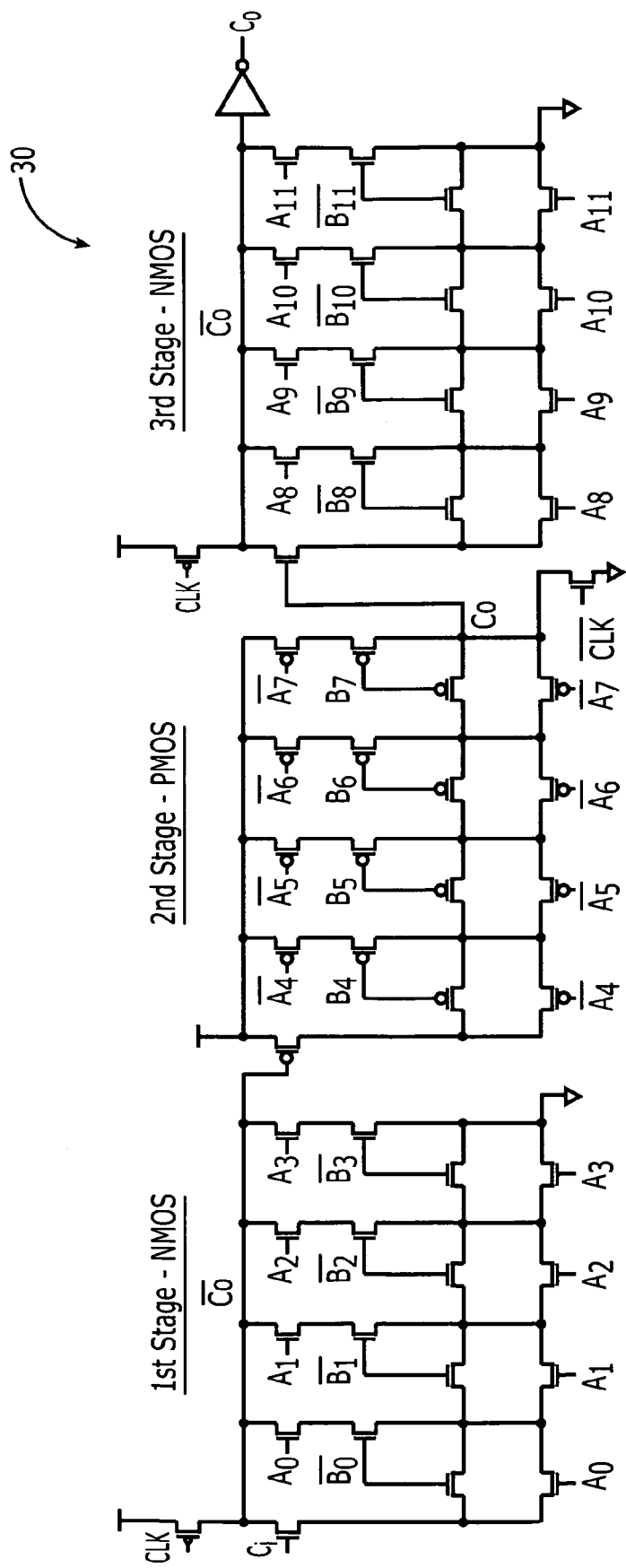
FIG. 3 is an electrical schematic showing as 12-bit comparator having alternating 4-bit NMOS and PMOS transistor stages therein.

Referring now to FIG. 3, a 12-bit comparator 30 is illustrated as including an alternating arrangement of 4-bit stages containing NMOS transistors (as illustrated by FIG. 1B) or PMOS transistors. The 18-transistor stages illustrated by FIG. 3 are directly connected end-to-end without any inter-stage inverters for accelerating and re-strengthening signal propagation. Nonetheless, an inverting buffer (shown in FIG. 3) may be used to generate a final output control signal $C_o$ in the event the last n-bit stage of the comparator 30 is an NMOS stage. Alternatively, a non-inverting buffer (not shown) may be used to generate a final output control signal $C_o$ in the event the last n-bit stage of the comparator is a PMOS stage.

Applying the numeric example of FIG. 2A to the comparator 30 of FIG. 3 yields a control output signal $C_o$ (from the third 4-bit NMOS stage) equal to 0, which correctly identifies A1[11:0]≦B1[11:0]. In this example, A1[0:3]= 0001, /A1[4:7]=1101, A1[8:11]=1101, /B1[0:3]=1110, B1[4:7]=0010, /B1[8:11]=0000. As will be understood by those skilled in the art, a pre-encoder (not shown) of conventional design may be used to generate the complementary data values /A1[4:7], /B1[0:3] and /B1[8:11]. Based on these data values, the signal $/C_o$ for the first stage equals 1, the intermediate control output signal $C_o$ for the second stage equals 0 and the control output signal $C_o$ for the third stage equals 0. Applying the numeric example of FIG. 2B to the comparator 30 of FIG. 3 yields a control output signal $C_o$ (from the third 4-bit NMOS stage) equal to 1, which correctly identifies A2[11:0]>B2[11:0]. In this example, A2[0:3]=0001, /A2[4:7]=1001, A2[8:11]=1101, /B2[0:3]= 1110, B2[4:7]=0010, /B2[8:11]=0010. Based on these data values, the signal /$C_o$ for the first stage equals 1, the intermediate control output signal $C_o$ for the second stage equals 1 and the control output signal $C_o$ for the third stage equals 1. Applying the numeric example of FIG. 2C to the comparator 30 of FIG. 3 yields a control output signal $C_o$ (from the third 4-bit NMOS stage) equal to 1, which correctly identifies A3[11:0]>B3[11:0]. In this example, A3[0:3]=0001, /A3[4:7]=1101, A3[8:11]=1111, /B3[0:3]= 1110, B3[4:7]=0010, /B3[8:11]=0010. Based on these data values, the signal /$C_o$ for the first stage equals 1, the intermediate control output signal $C_o$ for the second stage equals 0 and the control output signal $C_o$ for the third stage equals 1.

Figure 4A:
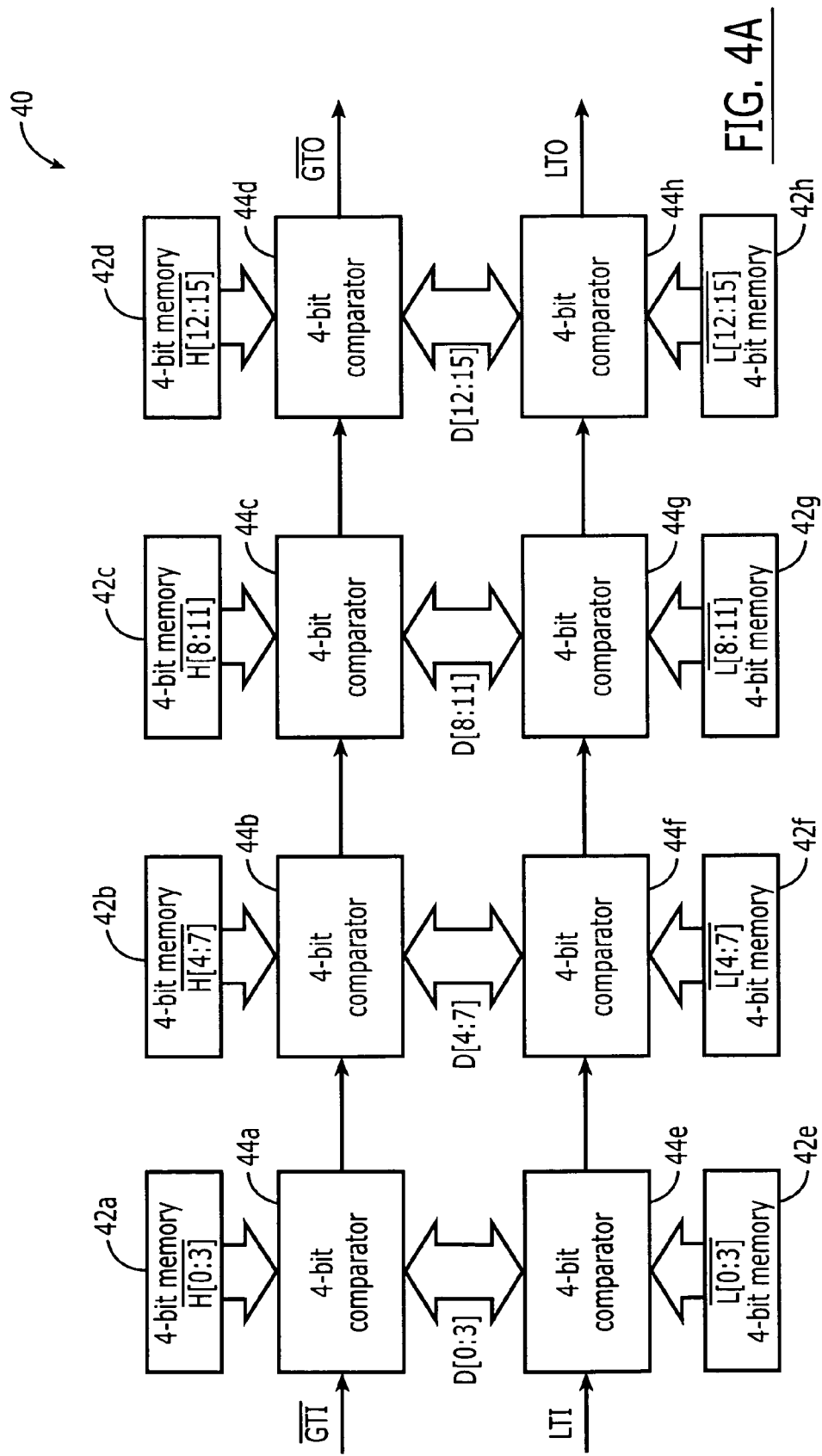
FIG. 4A is block diagram of a four-stage range match circuit according to embodiments of the present invention.

FIG. 4A illustrates a range match circuit 40 according to embodiments of the present invention. This range match circuit 40 is illustrated as a 4-stage circuit that is configured to process a 16-bit operand in a LSB (least significant bit) to MSB (most significant bit) sequence, with two control signals (/GTO and LTO) passing between adjacent stages of the circuit. This 16-bit operand is illustrated as D[0:15]. The first stage of the range match circuit 40 includes an upper 4-bit memory element 42a, which is configured to store a 4-bit upper bound data value (shown as /H[0:3]), and a lower 4-bit memory element 42e, which is configured to store a 4-bit lower bound value (shown as /L[0:3]). The first stage of the range match circuit 40 also includes a pair of 4-bit comparators 44a and 44e. These 4-bit comparators 44a and 44e may be configured as illustrated by FIGS. 1B-1E. The second stage of the range match circuit 40 includes an upper 4-bit memory element 42b, which is configured to store a 4-bit upper bound data value (shown as /H[4:7]), and a lower 4-bit memory element 42f, which is configured to store a 4-bit lower bound value (shown as /L[4:7]). The second stage of the range match circuit 40 also includes a pair of 4-bit comparators 44b and 44f. These 4-bit comparators 44b and 44f may be configured as illustrated by FIGS. 1B-1E. The third stage of the range match circuit 40 includes an upper 4-bit memory element 42c, which is configured to store a 4-bit upper bound data value (shown as /H[8:11]), and a lower 4-bit memory element 42g, which is configured to store a 4-bit lower bound value (shown as /L[8:11]). The third stage of the range match circuit 40 also includes a pair of 4-bit comparators 44c and 44g. These 4-bit comparators 44c and 44g may be configured as illustrated by FIGS. 1B-1E. The fourth stage of the range match circuit 40 includes an upper 4-bit memory element 42d, which is configured to store a 4-bit upper bound data value (shown as /H[12:15]), and a lower 4-bit memory element 42h, which is configured to store a 4-bit lower bound value (shown as /L[12:15]). The fourth stage of the range match circuit 40 also includes a pair of 4-bit comparators 44d and 44h. These 4-bit comparators 44d and 44h may be configured as illustrated by FIGS. 1B-1E.

Figure 4B:
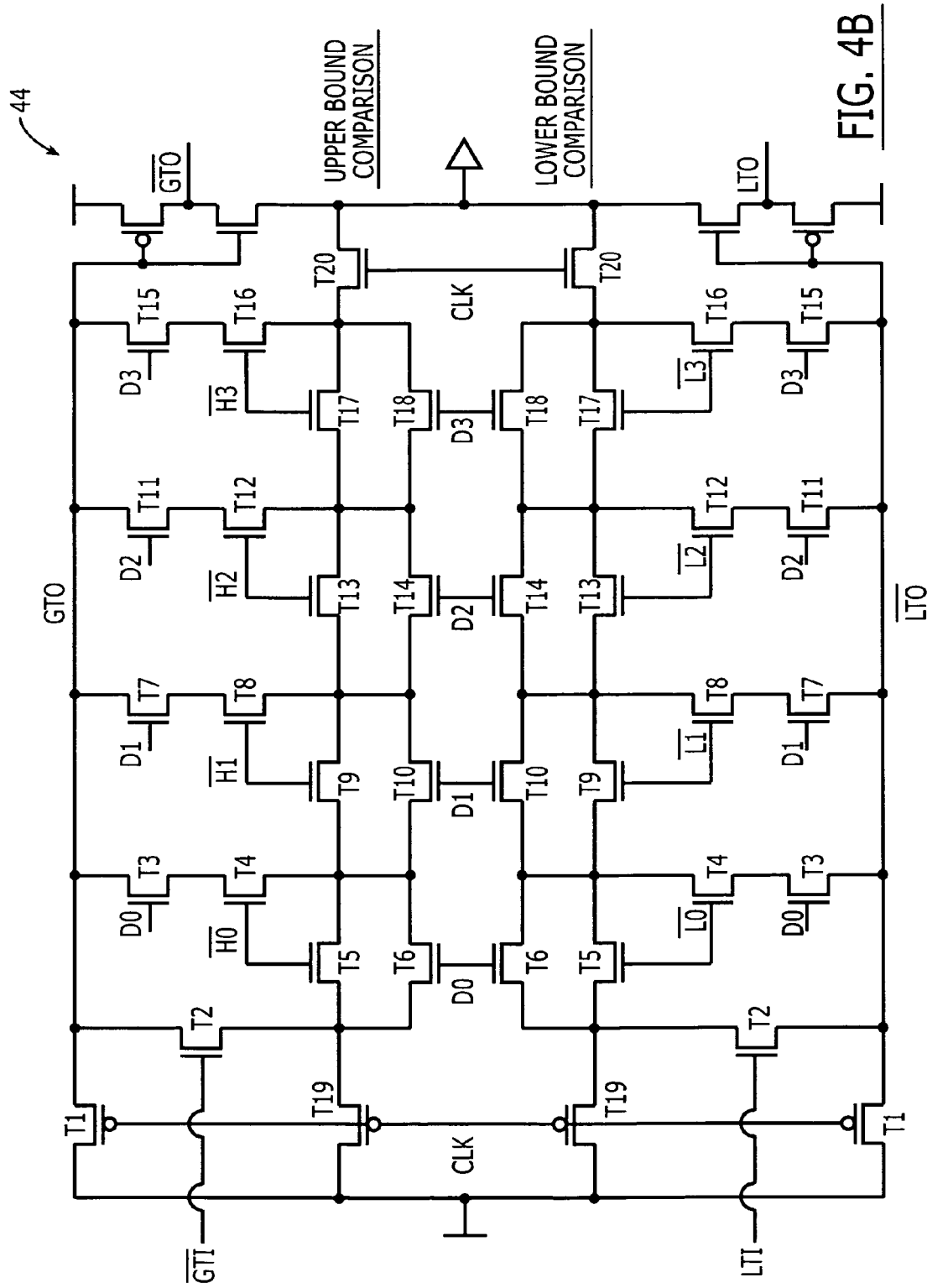
FIG. 4B is an electrical schematic of a 4-bit range match cell according to embodiments of the present invention.

Referring now to FIG. 4B, the 4-bit comparators 44a and 44e associated with the first stage of the range match circuit 40 may be configured as a 44 transistor range match cell 44. This range match cell 44 includes an upper bound comparison circuit and a lower bound comparison circuit. The upper bound comparison circuit generates an upper bound control output signal /GTO in response to an upper bound control input signal /GTI. The lower bound comparison circuit generates a lower bound control output signal LTI in response to a lower bound control input signal LTO. These upper and lower bound comparison circuits are each equivalent to the 4-bit comparator 10d illustrated by FIG. 1D. Accordingly, expression (4) can be rewritten as follows to illustrate upper bound and lower bound comparison operations:

$$\overline{GTO}=(((\overline{GTI}(D_0+\overline{H}_0)+D_0\overline{H}_1)(D_1\overline{H}_1)+D_2\overline{H}_2)(D_3\overline{H}_3)+D_3\overline{H}_3, \quad (7)$$

and $$LTO=(((LTI(D_0+\overline{L}_0)+D_0\overline{L}_0)(D_1+\overline{L}_0)+D_1\overline{L}_1)(D_2+\overline{L}_2)+D_2\overline{L}_2)(D_3+\overline{L}_3)+D_3\overline{L}_3. \quad (8)$$

Figure 5A:
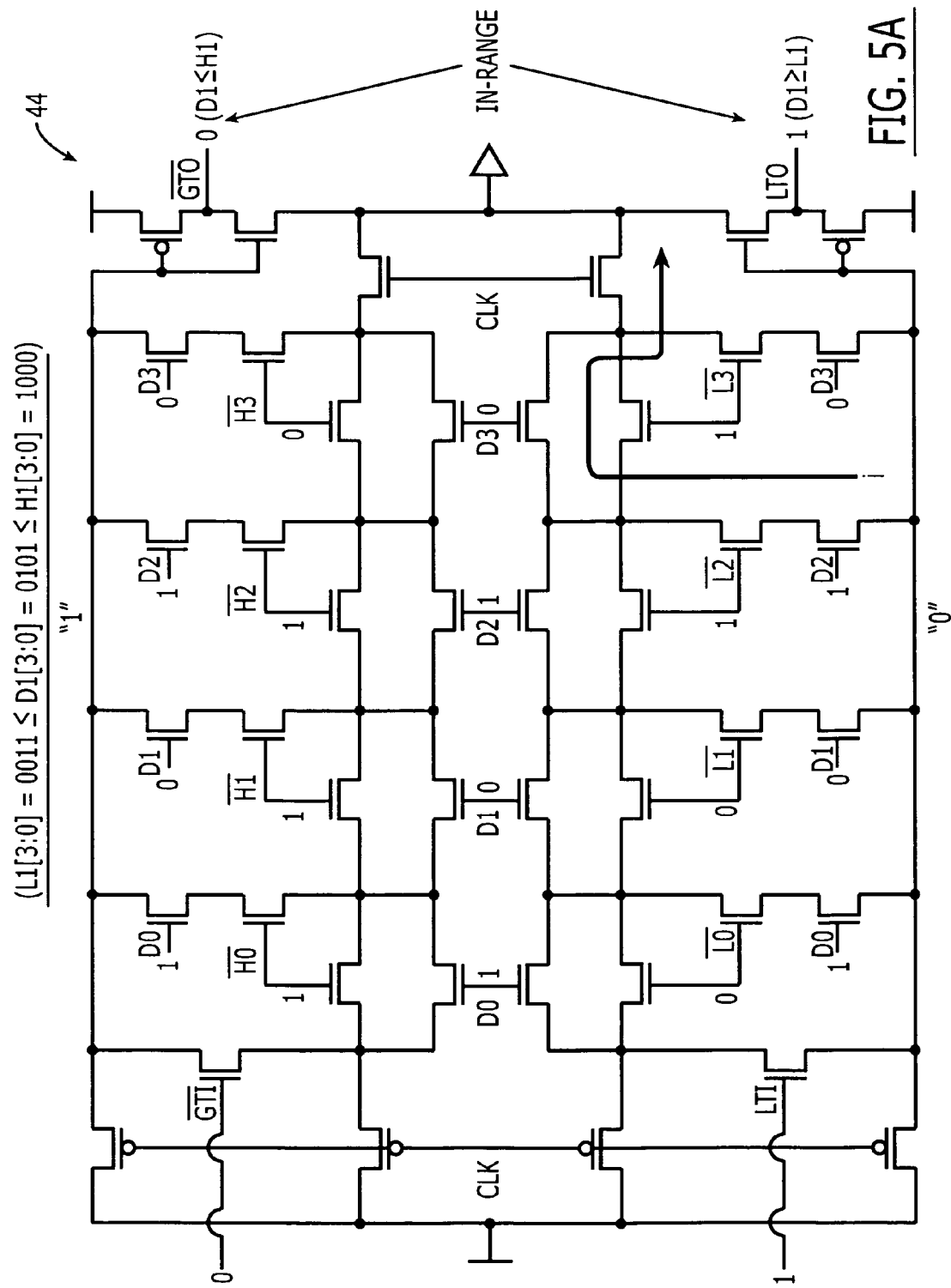
FIG. 5A is an electrical schematic of the 4-bit range match cell of FIG. 4B with annotations that illustrate an in-range match example.
Figure 5B:
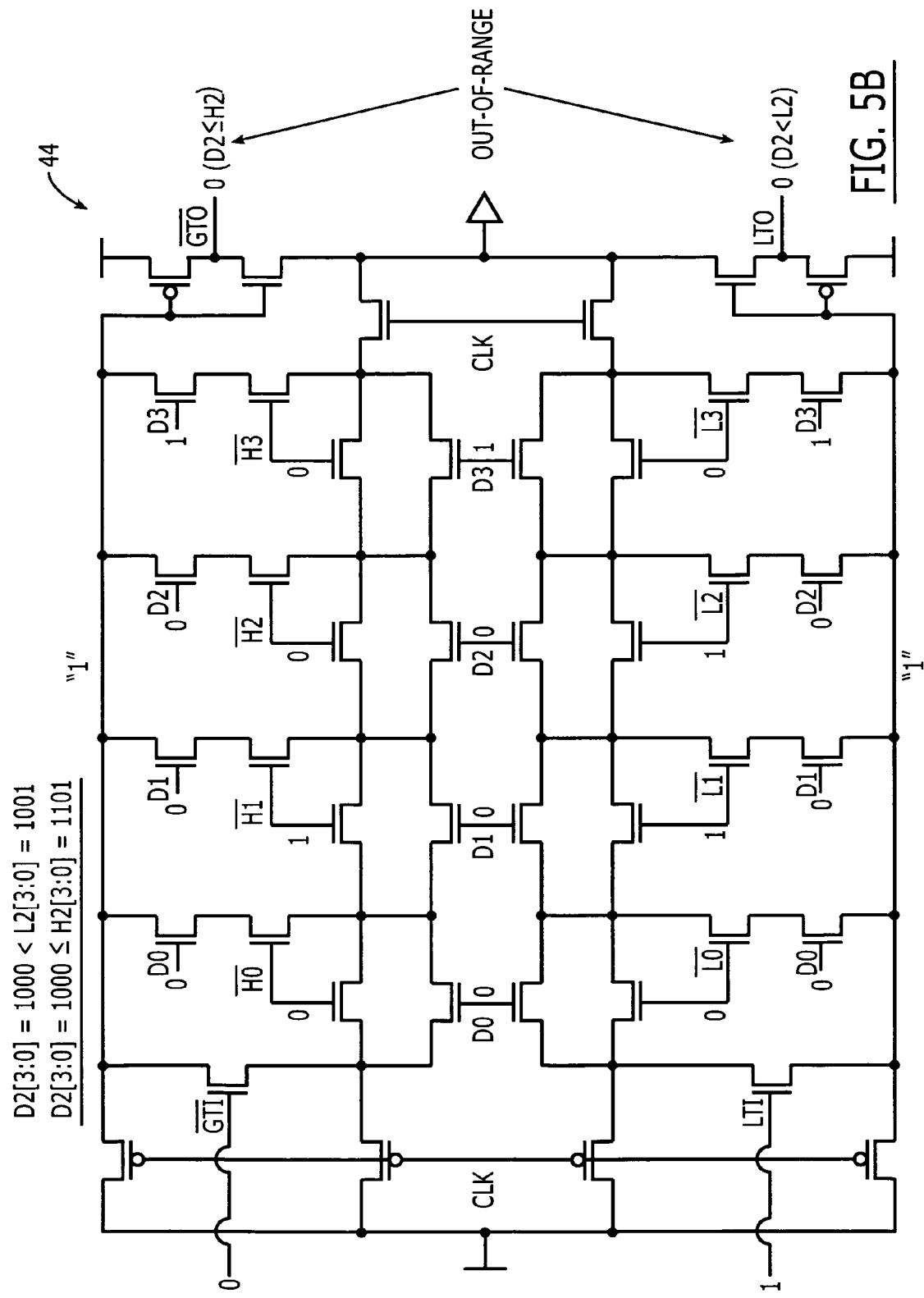
FIG. 5B is an electrical schematic of the 4-bit range match cell of FIG. 4B with annotations that illustrate an out-of-range match example.

Operation of the range match cell 44 will now be described more fully with respect to FIGS. 5A-5C. In FIG. 5A, a range match cell 44 is illustrated as performing a range check operation to determine whether an applied data value D1[3:0]=0101 is within a range between an upper bound value H1[3:0]=1000 and a lower bound value L1[3:0]=0011. This operation causes the upper bound control output signal /GTO to be pulled to a logic 0 value to reflect the fact that D1$\leq$H1 and causes the lower bound control output signal LTO to be pulled to a logic 1 value to reflect the fact that D1$\geq$L1 (see, e.g., TABLE 1, where A$\leq$B when $C_i$ (/GTI)=0 and $C_o$ (/GTO)=0 and A$\geq$B when $C_i$ (LTI)=1 and $C_o$ (LTO)=1). In FIG. 5B, a range match cell 44 is illustrated as performing a range check operation to determine whether an applied data value D2[3:0]=1000 is within a range between an upper bound value H2[3:0]=1101 and a lower bound value L2[3:0]=1001. This operation causes the upper bound control output signal /GTO to be pulled to a logic 0 value to reflect the fact that D2$\leq$H2 and causes the lower bound control output signal LTO to be pulled to a logic 0 value to reflect the fact that D2<L2 (i.e., out-of-range). Finally, in FIG. 5C, a range match cell 44 is illustrated as performing a range check operation to determine whether an applied data value D3[3:0]=1010 is within a range between an upper bound value H3[3:0]=1001 and a lower bound value L3[3:0]=0010. This operation causes the upper bound control output signal /GTO to be pulled to a logic 1 value to reflect the fact that D3>H3 (i.e., out-of-range) and causes the lower bound control output signal LTO to be pulled to a logic 1 value to reflect the fact that D3$\geq$L3.

Figure 6A:
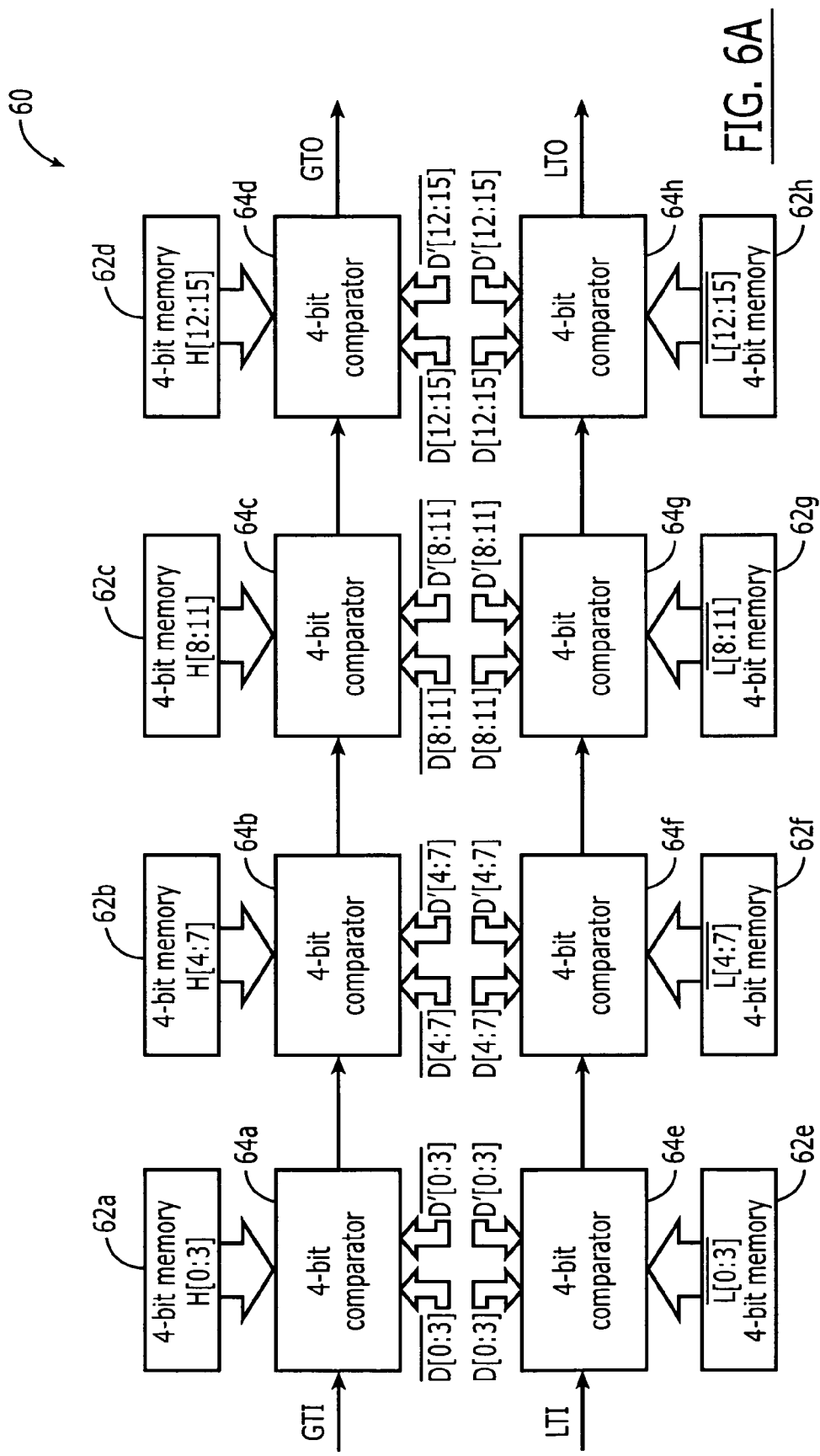
FIG. 6A is a block diagram of a four-stage multi-functional range match circuit according to embodiments of the present invention.

FIG. 6A is a block diagram of a four-stage multi-functional range match circuit 60 according to additional embodiments of the present invention. This range match circuit 60 is illustrated as a 4-stage circuit that is configured to process 16-bit operands in a LSB (least significant bit) to MSB (most significant bit) sequence, with two control signals (GTO and LTO) passing between adjacent stages of the circuit. These 16-bit operands are illustrated as the following differential signals: first operand=(D[0:15], /D[0:15]) and second operand=(D'[0:15], /D'[0:15]). As described more fully hereinbelow, the range match circuit 60 is configured to perform range match operations when the first and second operands are set to equivalent binary values by a data line driver (not shown). Alternatively, the range match circuit 60 is configured to perform operations of a NOR-type ternary CAM circuit when the second operand is masked (i.e., D'[0:15]=/D'[0:15]=all 1s) or a NAND-type ternary CAM circuit when the first operand is masked (i.e., D[0: 15]=/D[0:15]=all 0s).

The first stage of the range match circuit 60 includes an upper 4-bit memory element 62a, which is configured to store a 4-bit upper bound data value (shown as H[0:3]), a lower 4-bit memory element 62e, which is configured to store a 4-bit lower bound value (shown as /L[0:3]), and a pair of 4-bit comparators 64a and 64e. The second stage of the range match circuit 60 includes an upper 4-bit memory element 62b, which is configured to store a 4-bit upper bound data value (shown as H[4:7]), a lower 4-bit memory element 62f, which is configured to store a 4-bit lower bound value (shown as /L[4:7]), and a pair of 4-bit comparators 64b and 64f. The third stage of the range match circuit 60 includes an upper 4-bit memory element 62c, which is configured to store a 4-bit upper bound data value (shown as H[8:11]), a lower 4-bit memory element 62g, which is configured to store a 4-bit lower bound value (shown as /L[8:11]), and a pair of 4-bit comparators 64c and 64g. The fourth stage of the range match circuit 60 includes an upper 4-bit memory element 62d, which is configured to store a 4-bit upper bound data value (shown as H[12:15]), a lower 4-bit memory element 62h, which is configured to store a 4-bit lower bound value (shown as /L[12:15]), and a pair of 4-bit comparators 64d and 64h.

Figure 6B:
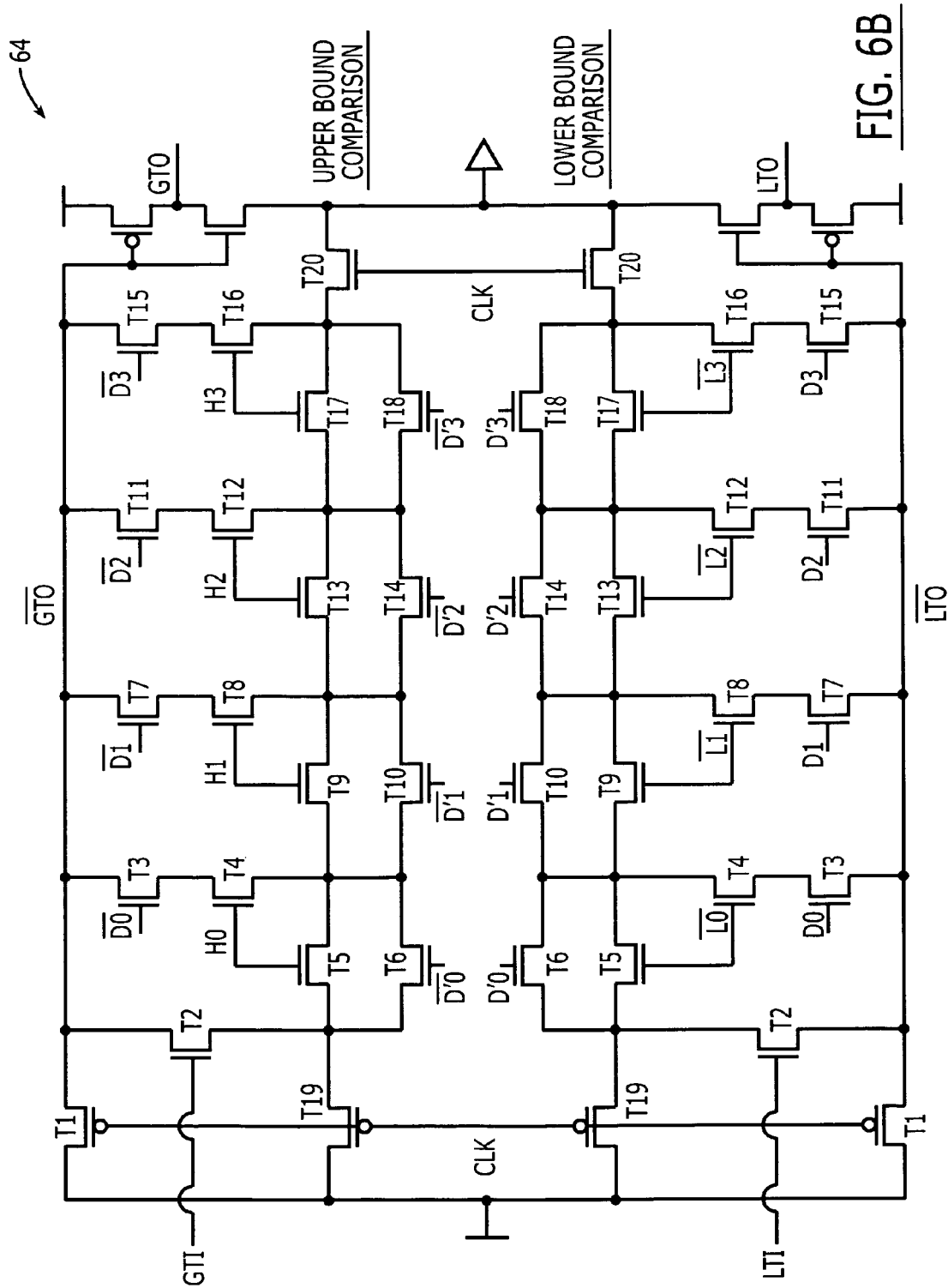
FIG. 6B is an electrical schematic of a 4-bit multi-functional range match cell according to embodiments of the present invention.

Referring now to FIG. 6B, the 4-bit comparators 64a and 64e associated with the first stage of the range match circuit 60 may be configured as a 44 transistor range match cell 64. This range match cell 64 includes an upper bound comparison circuit and a lower bound comparison circuit. These comparison circuits are similar to the upper and lower bound comparison circuits in FIG. 4B, however, the 22 transistor upper bound comparison circuit in FIG. 6B performs complementary operations relative to the upper bound comparison circuit of FIG. 4B by virtue of the fact that the input signals D0-D3, D'0-D'3, and /H0-/H3 in FIG. 4B have been replaced by the following signals: /D0-/D3, /D'0-/D'3 and H0-H3 in FIG. 6B. The upper bound comparison circuit of FIG. 6B generates an upper bound control output signal GTO in response to an upper bound control input signal GTI. The lower bound comparison circuit generates a lower bound control output signal LTO in response to a lower bound control input signal LTI. For the case of the first stage of the range match circuit 60, the lower bound control input signal LTI and the upper bound control input signal GTI are set to logic 1 values. Moreover, an output signal GTO associated with the last stage will reflect a "≦" condition when GTO=1 and a ">" condition when GTO=0. The output signal LTO associated with the last stage will reflect a "≧" condition when LTO=1 and a "<" condition when LTO=0.

This range match cell 64 is configured to evaluate whether an applied operand D[n−1, . . . , 0]=D'[n−1, . . . , 0] is within a range between an upper bound H[n−1, . . . , 0] and a lower bound L[n−1, . . . , 0], in accordance with the following upper bound and lower bound relationships:

$$GTO = (((GTI(\overline{D_0}+H_0)+\overline{D_0}H_1)(\overline{D_1}H_1)+\overline{D_1}H_1)(\overline{D_2}+H_2)+ \overline{D_2}H_2)(\overline{D_3}+H_3)+\overline{D_3}H_3, \quad (9)$$

and $$LTO = (((LTI(D_0+\overline{L_0})+D_0\overline{L_0})(D_1+\overline{L_1})+D_1\overline{L_2})(D_3+ \overline{L_3})+D_2\overline{L_2})(D_3+\overline{L_3})+D_3\overline{L_3}. \quad (10)$$

As illustrated, expression (9) is a complementary equivalent to expression (7) and expression (10) is identical to expression (8).

Figure 6C:
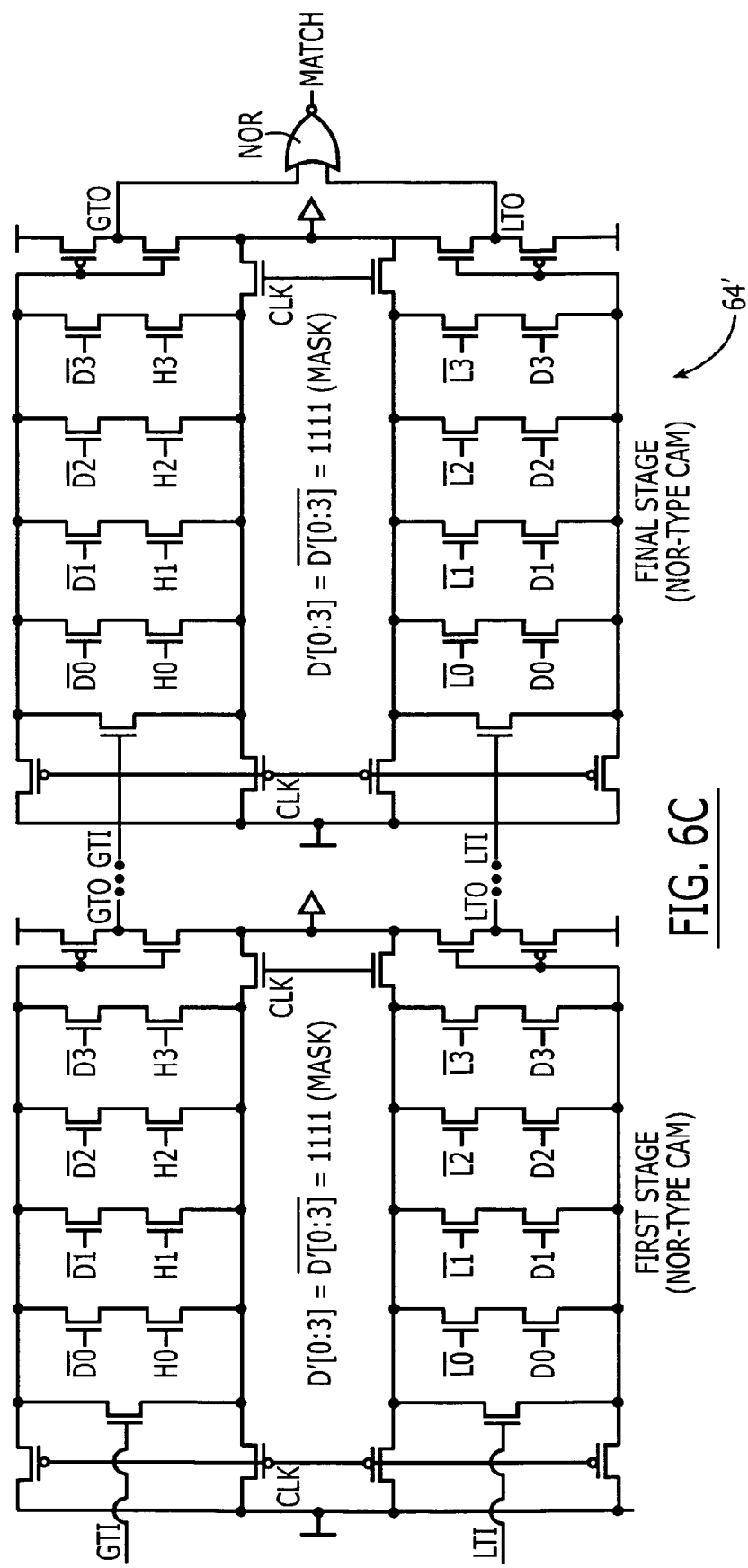
FIG. 6C is an electrical schematic of a multi-functional range match circuit configured as a NOR-type CAM circuit.

A plurality of the range match cells 64 of FIG. 6B may be cascaded end-to-end and configured to operate as a multi-stage NOR-type CAM circuit by masking the differential operand D' (i.e., D'[0:n]=/D'[0:n]=all 1s) and setting GTI and LTI for the first stage to "0". This masking of the operand D' causes transistors T6, T10, T14 and T18 to provide "short circuits" across transistors T5, T9, T13 and T18. This NOR-type CAM circuit 64', which is illustrated by FIG. 6C, includes a final stage NOR logic gate that converts the control output signals GTO and LTO into a match signal MATCH. This match signal MATCH remains high upon completion of a search operation if and only if the applied differential search data (D[0:n] and /D[0:n]) matches an entry R stored within the CAM circuit 64'. Each bit of this CAM entry is set in accordance with the following ternary truth table:

TABLE 3

| VALUE | STORED DATA | | APPLIED DATA | |
|---|---|---|---|---|
| R | H | /L | D | /D |
| X (MASK) | 0 | 0 | 0 | 0 |
| 0 | 0 | 1 | 0 | 1 |
| 1 | 1 | 0 | 1 | 0 |
| INVALID | 1 | 1 | — | — |

Accordingly, based on this truth table, if the applied search data D[0:7]=11011000 and the stored 8-bit entry R[0:7]=01XX10X0, then a "miss" (i.e., MATCH=0) will be detected by virtue of the fact that GTO and LTO from the final stage will be set to 0 and 1, respectively. Alternatively, if the applied search data D[0:7]=11010000 and the stored 8-bit entry R[0:7]=01XX10X0, then a "miss" (i.e., MATCH=0) will be detected by virtue of the fact that GTO and LTO from the final stage will be set to 1 and 1, respectively. Alternatively, if the applied search data D[0:7]=01011000 and the stored 8-bit entry R[0:7]=01XX10X0, then a match (i.e., MATCH=1) will be detected by virtue of the fact that GTO and LTO from the final stage will be set to 0 and 0, respectively. Finally, if the applied search data D[0:7]=01010000 and the stored 8-bit entry R[0:7]=01XX10X0, then a miss will be detected by virtue of the fact that GTO and LTO from the final stage will be set to 1 and 0, respectively.

Figure 6D:
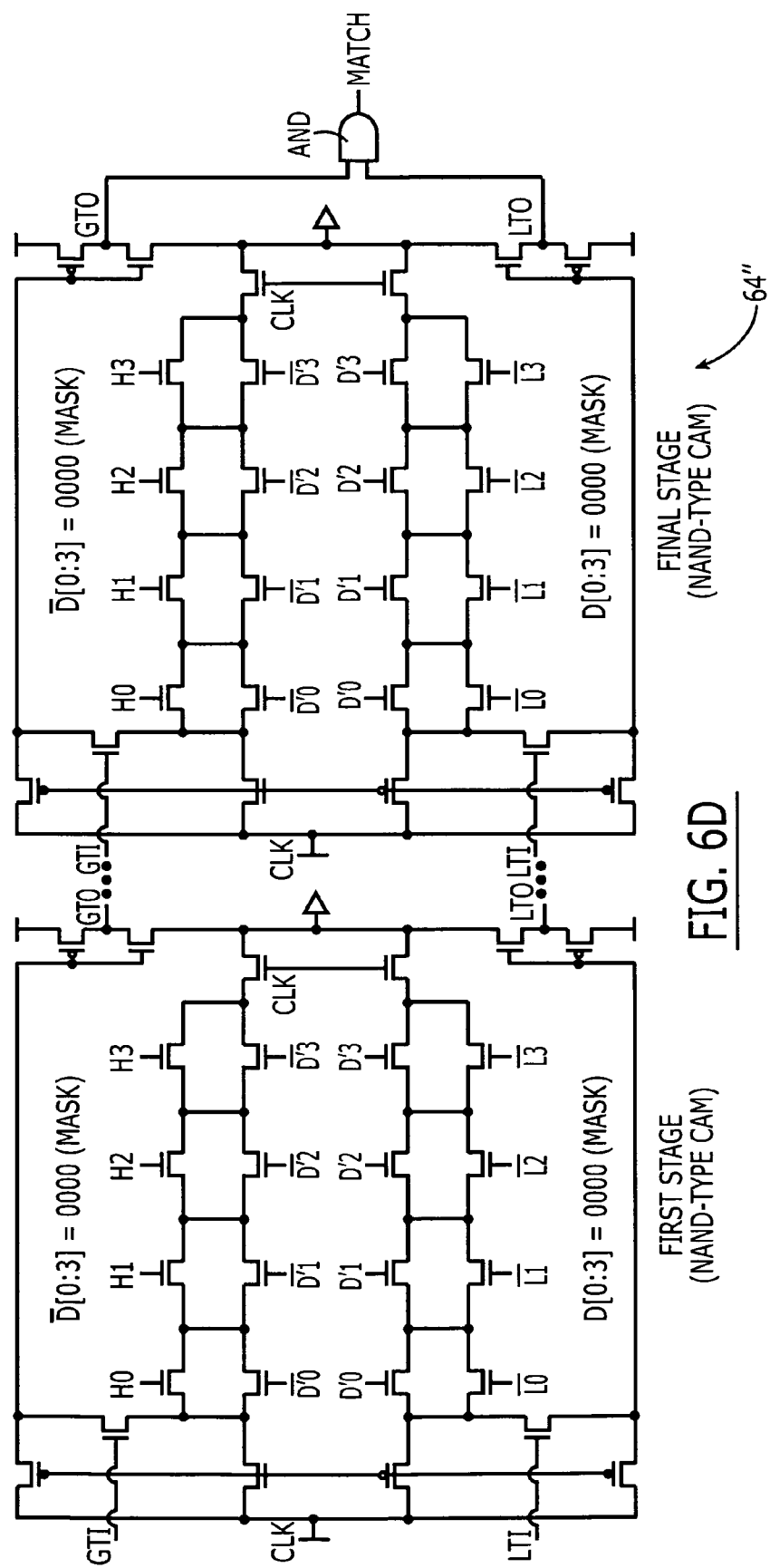
FIG. 6D is an electrical schematic of a multi-functional range match circuit configured as a NAND-type CAM circuit.

Referring now to FIG. 6D, a plurality of the range match cells 64 of FIG. 6B may be cascaded end-to-end and configured to operate as a multi-stage NAND-type CAM circuit by masking the differential operand D (i.e., D[0:n]=/D[0:n]=all 0s) and setting GTI and LTI for the first stage to "1". This masking of the operand D causes transistors T3, T7, T11 and T15 to become "open circuits" This NAND-type CAM circuit 64", which is illustrated by FIG. 6D, includes a final stage AND logic gate that converts the control output signals GTO and LTO into a match signal MATCH. This match signal MATCH remains high upon completion of a search operation if and only if the applied differential search data (D'[0:n] and /D'[0:n]) matches an entry R stored within the CAM circuit 64". Each bit of this CAM entry is set in accordance with the following ternary truth table:

TABLE 4

| VALUE | STORED DATA | | APPLIED DATA | |
|---|---|---|---|---|
| R | H | /L | D' | /D' |
| DISABLE | 0 | 0 | — | — |
| 0 | 0 | 1 | 0 | 1 |
| 1 | 1 | 0 | 1 | 0 |
| X (MASK) | 1 | 1 | 1 | 1 |

Additional details regarding the operation of alternative NAND-type CAM circuits are disclosed in commonly assigned U.S. application Ser. No. 11/137,163, filed May 25, 2005, the disclosure of which is hereby incorporated herein by reference.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An integrated circuit device, comprising:
a multi-functional match cell responsive to first and second n-bit operands, said multi-functional match cell configured so that said match cell operates as an n-bit range match cell when the first and second n-bit operands are equivalent, as an n-bit NOR-type CAM cell when the second n-bit operand is masked and as an n-bit NAND-type CAM cell when the first n-bit operand is masked, where "n" is a positive integer greater than one.

2. The integrated circuit device of claim 1, wherein the multi-functional match cell comprises:
an upper bound comparison circuit responsive to an upper bound or its complement; and
a lower bound comparison circuit responsive to a lower bound or its complement.

3. The integrated circuit device of claim 2, wherein the first n-bit operand is an n-bit differential signal D and /D and the second n-bit operand is an n-bit differential signal D' and /D'; and wherein said upper bound comparison circuit is responsive to /D and /D'(or D and D') and said lower bound comparison circuit is responsive to D and D' (or /D and /D').

4. The integrated circuit device of claim 3, wherein the second n-bit operand is masked by setting D' and /D' to all 1s.

5. The integrated circuit device of claim 4, wherein the first n-bit operand is masked by setting D and /D to all 0s.

6. An integrated circuit device, comprising:
a multi-functional match cell responsive to first and second n-bit operands, said multi-functional match cell configured so that said match cell operates as an n-bit range match cell when the first and second n-bit operands are equivalent, as an n-bit NOR-type CAM cell when the second n-bit operand is masked and as an n-bit NAND-type CAM cell when the first n-bit operand is masked, where "n" is a positive integer greater than one, said multi-functional match cell comprising:
an upper bound comparison circuit responsive to an upper bound or its complement; and
a lower bound comparison circuit responsive to a lower bound or its complement;
wherein the first n-bit operand is an n-bit differential signal D and /D and the second n-bit operand is an n-bit differential signal D' and /D';
wherein said upper bound comparison circuit is responsive to /D and /D'(or D and D') and said lower bound comparison circuit is responsive to D and D' (or /D and /D'): and
wherein said upper bound comparison circuit is configured to evaluate whether the first n-bit operand D [n−1, . . . , 0] applied thereto is "≦" or ">" the upper bound H[n−1, . . . , 0] in accordance with the following upper bound relationship or its boolean or complementary equivalents:

$$GTO = (((GTI(\overline{D_0}+H_0)+\overline{D_0}H_0)(\overline{D_1}+H_1)+\overline{D_1}H_1)$$
$$(\overline{D_2}+H_2)+\overline{D_2}H_2)(\overline{D_3}+H_3)+\overline{D_3}H_3,$$

where GTI is an upper bound control input signal and GTO is an upper bound control output signal.

7. The integrated circuit device of claim 6, wherein said lower bound comparison circuit is configured to evaluate whether the first n-bit operand D[n−1, . . . , 0] applied thereto is "<" or "≧" the lower bound L[n−1, . . . , 0] in accordance with the following lower bound relationship or its boolean or complementary equivalents:

$$LTO = ( \ldots ((LTI(D_0+\overline{L_0})+D_0\overline{L_0})(D_1+\overline{L_1})+D_1\overline{L_1}) \ldots$$
$$(D_{n-2}+\overline{L_{n-2}})+D_{n-2}\overline{L_{n-2}})(D_{n-1}+\overline{L_{n-1}})+D_{n-1}\overline{L_{n-1}},$$

where LTI is a lower bound control input signal and LTO is a lower bound control output signal.

8. An integrated circuit device, comprising:
a range match circuit configured to evaluate whether an operand D[n−1, . . . , 0] applied thereto is within a range between an upper bound H[n−1, . . . , 0] and a lower bound L[n−1, . . . , 0], in accordance with the following upper bound and lower bound relationships or their boolean or complementary equivalents:

$$\overline{GTO} = ( \ldots ((\overline{GTI}(D_0+\overline{H_0})+D_0\overline{H_0})(D_1+\overline{H_1})+D_1\overline{H_1}) \ldots (D_{n-2}+\overline{H_{n-2}})+D_{n-2}\overline{H_{n-2}})(D_{n-1}+\overline{H_{n-1}})+D_{n-1}\overline{H_{n-1}}, \text{ and}$$

$$LTO = ( \ldots ((LTI(D_0+\overline{L_0})+D_0\overline{L_0})(D_1+\overline{L_1})+D_1\overline{L_1}) \ldots$$
$$(D_{n-2}+\overline{L_{n-2}})+D_{n-2}\overline{L_{n-2}})(D_{n-1}+\overline{L_{n-1}})+D_{n-1}\overline{L_{n-1}},$$

where LTI and /GTI are control input signals and LTO and /GTO are control output signals.

9. A range match circuit, comprising:
an n-bit range match cell responsive to upper and lower bound control input signals and a multi-bit operand, said match cell configured to generate an upper bound control output signal that encodes a ">" inequality between the multi-bit operand and an upper bound operand and a "<" inequality between the multi-bit operand and a lower bound operand when the upper bound control signal is in a first logic state and the lower bound control signal is in a second logic state opposite the first logic state, where "n" is a positive integer greater than one.

* * * * *